(12) United States Patent
Ishizeki et al.

(10) Patent No.: US 9,146,462 B2
(45) Date of Patent: Sep. 29, 2015

(54) NEGATIVE PHOTOSENSITIVE RESIN COMPOSITION, PARTITION WALLS FOR OPTICAL DEVICE AND PRODUCTION PROCESS THEREOF, PROCESS FOR PRODUCING OPTICAL DEVICE HAVING THE PARTITION WALLS, AND INK REPELLENT SOLUTION

(71) Applicant: ASAHI GLASS COMPANY, LIMITED, Chiyoda-ku (JP)

(72) Inventors: Kenji Ishizeki, Chiyoda-ku (JP); Yutaka Furukawa, Chiyoda-ku (JP)

(73) Assignee: Asahi Glass Company, Limited, Chiyoda-ku (JP)

(*) Notice: Subject to any disclaimer, the term of this patent is extended or adjusted under 35 U.S.C. 154(b) by 78 days.

(21) Appl. No.: 13/914,064

(22) Filed: Jun. 10, 2013

(65) Prior Publication Data

US 2013/0266778 A1   Oct. 10, 2013

Related U.S. Application Data

(63) Continuation of application No. PCT/JP2011/078488, filed on Dec. 8, 2011.

(30) Foreign Application Priority Data

Dec. 10, 2010   (JP) .................. 2010-276315

(51) Int. Cl.
*G03F 7/075* (2006.01)
*G03F 7/004* (2006.01)
(Continued)

(52) U.S. Cl.
CPC .............. *G03F 7/004* (2013.01); *C08G 65/007* (2013.01); *C08G 65/336* (2013.01); *C08G 77/16* (2013.01);
(Continued)

(58) Field of Classification Search
CPC ..... G03F 7/004; G03F 7/0046; G03F 7/0755; G03F 7/20; G03F 7/0757; C08G 77/16; C08G 77/24; C09D 183/08
USPC ................ 430/270.1, 927, 913, 281.1, 286.1; 525/474
See application file for complete search history.

(56) References Cited

U.S. PATENT DOCUMENTS 7,232,648 B2    6/2007  Takahashi et al.
8,557,502 B2 *  10/2013 Furukawa .................. 430/281.1
(Continued)

FOREIGN PATENT DOCUMENTS

CN       1629222 A      6/2005
JP       2002-22933     1/2002
(Continued)

*Primary Examiner* — Amanda C Walke
(74) *Attorney, Agent, or Firm* — Oblon, McClelland, Maier & Neustadt, L.L.P.

(57) ABSTRACT

To provide a negative photosensitive resin composition which is excellent in storage stability of silanol groups and which is applicable to preparation of partition walls which can maintain excellent ink repellency even after ink affinity-imparting treatment, and partition walls for an optical device using such a composition.

A negative photosensitive resin composition comprising an ink repellent (A) made of a fluorosiloxane compound having a hydroxy group bonded to a silicon atom and containing fluorine atoms in a proportion of from 10 to 55 mass % based on the total amount of the compound, a photosensitive resin (B) having an acidic group and an ethylenic double bond in one molecule, a photopolymerization initiator (C) and a solvent (D), wherein the proportion of the ink repellent (A) is from 0.01 to 10 mass % based on the total solid content of the composition, and the proportion of the hydroxy groups bonded to a silicon atom derived from the ink repellent (A) is from 0.000001 to 1.0 mmol/g based on the total amount of the composition.

20 Claims, 1 Drawing Sheet

(I)

(II)

(III)

(51) Int. Cl.
*G02B 5/20* (2006.01)
*G02B 5/22* (2006.01)
*C08G 65/00* (2006.01)
*C08L 83/08* (2006.01)
*G03F 7/00* (2006.01)
*G03F 7/032* (2006.01)
*C08G 77/16* (2006.01)
*C08G 77/24* (2006.01)
*C08G 65/336* (2006.01)
*H01L 27/32* (2006.01)

(52) U.S. Cl.
CPC ............... *C08G 77/24* (2013.01); *C08L 83/08* (2013.01); *G02B 5/201* (2013.01); *G02B 5/223* (2013.01); *G03F 7/0005* (2013.01); *G03F 7/0046* (2013.01); *G03F 7/032* (2013.01); *G03F 7/0755* (2013.01); *G03F 7/0757* (2013.01); *H01L 27/3246* (2013.01); *Y10T 428/24802* (2015.01)

(56) References Cited

U.S. PATENT DOCUMENTS

2006/0003256 A1    1/2006  Takahashi et al.
2011/0117333 A1    5/2011  Furukawa

FOREIGN PATENT DOCUMENTS

| JP | 2004-86011 | 3/2004 |
| JP | 2007-2194 | 1/2007 |
| JP | 2009-205137 | 9/2009 |
| JP | 2010-185938 | 8/2010 |
| WO | 2004/079454 | 9/2004 |
| WO | WO 2005014745 A1 * | 2/2005 |
| WO | 2007/132892 | 11/2007 |
| WO | 2010/013816 | 2/2010 |

* cited by examiner

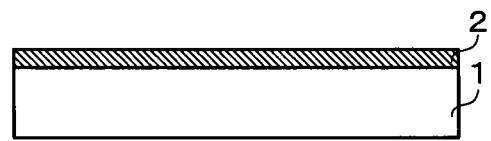
(I)
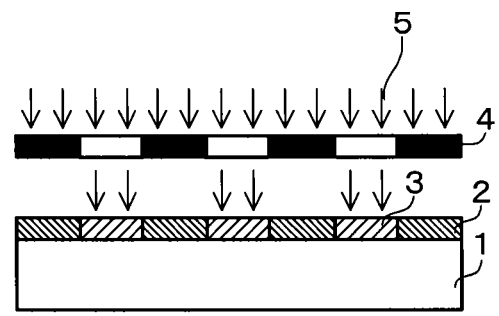
(II)
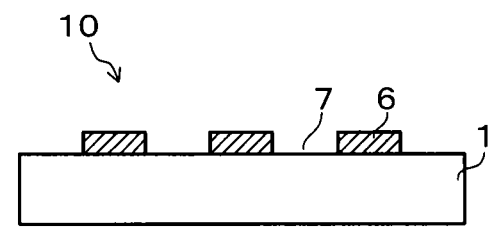
(III)

NEGATIVE PHOTOSENSITIVE RESIN COMPOSITION, PARTITION WALLS FOR OPTICAL DEVICE AND PRODUCTION PROCESS THEREOF, PROCESS FOR PRODUCING OPTICAL DEVICE HAVING THE PARTITION WALLS, AND INK REPELLENT SOLUTION

TECHNICAL FIELD

The present invention relates to an ink repellent solution, a negative photosensitive resin composition, partition walls for an optical device and a production process thereof, and a process for producing an optical device having a plurality of pixels partitioned by the partition walls, and an ink repellent solution.

BACKGROUND ART

A resist composition has attracted attention as a material to form a permanent film for e.g. partition walls between pixels of a color filter, partition walls between pixels of an organic EL (electro-luminescence) display device, partition walls between devices of an organic EL lighting, partition walls partitioning TFTs (thin film transistors) of an organic TFT array, partition walls for ITO electrodes of a liquid crystal display device, and partition walls of a circuit wiring substrate.

Further, a low cost process utilizing ink jet recording technology of injecting a liquid by an ink jet after formation of the above partition walls, has been proposed.

For example, in the production of a color filter, an ink jet method has been proposed to jet and apply R (red), G (green) and B (blue) inks within fine pixels. Here, formation of a pixel pattern is carried out by photolithography using a resist composition, and a photosensitive cured product of the resist composition is utilized as partition walls between pixels.

Further, in the production of an organic EL display device, an ink jet method has been proposed wherein a solution of a hole transport material or a luminescent material is jetted and applied to form hole transport layers or luminescent layers within fine pixels. Here, formation of a pixel pattern is carried out by photolithography using a resist composition, and a coating film cured product of the resist composition is utilized as partition walls between pixels.

Further, in the production of an organic TFT array, an ink jet method has been proposed wherein a solution of an organic semiconductor is jetted and applied. Formation of partition walls partitioning TFTs is carried out by photolithography using a resist composition, and a coating film cured product of the resist composition is utilized as the partition walls.

Further, in the production of a liquid crystal display device, an ink jet method has been proposed wherein an ITO (tin doped indium oxide) solution or dispersion is jetted and applied to form ITO electrodes, and formation of an ITO electrode pattern is carried out by photolithography using a resist composition, and a coating film cured product of the resist composition is utilized as partition walls.

Further, in the production of a circuit wiring substrate, an ink jet method has been proposed wherein a metal dispersion is jetted and applied to form circuit wirings. Here, formation of a circuit wiring pattern is carried out by photolithography using a resist composition, and a coating film cured product of the resist composition is utilized as partition walls.

In the ink jet method, it is necessary to prevent e.g. color mixing of inks between adjacent pixels, or to prevent the material jetted by an ink jet from attaching to or solidifying at portions other than the predetermined regions. Accordingly, the partition walls are required to have repellency against water or an organic solvent constituting the ink jet coating solution, i.e. a so-called ink repellency.

Accordingly, a resist composition to form the partition walls having an ink repellency has been proposed. For example, Patent Document 1 discloses a photosensitive resin composition comprising a silicon-containing resin having a polyfluoroalkyl group, a polydimethylsiloxane group and an ethylenic double bond.

When partition walls are formed by a coating film cured product of a resist composition, the resist composition at a portion to be dots (regions within which an ink is to be injected, surrounded by the partition walls) is removed in a development step. However, in a case where a resist composition to impart ink repellency to the partition walls is used, if its removal is insufficient, the residue of the composition will adversely affect the ink injection, and such is one cause of the edge leakage. Further, the partition walls are made of a coating film cured product of the resist composition, and molecules which did not undergo curing reaction remain in the partition walls, and such molecules migrate from the partition walls to the dots and contaminate the dots in the subsequent post-baking step, and such contamination is also considered to be one cause of the edge leakage.

In order to prevent the edge leakage, for the purpose of removing impurities remaining in the dots after formation of the partition walls, for example, it is considered to carry out an ink affinity-imparting treatment such as cleaning with an alkali aqueous solution, UV cleaning, UV ozone cleaning, excimer cleaning, corona discharge treatment or oxygen plasma treatment. However, if an ink affinity-imparting treatment is carried out by such a method, the ink repellency of the partition walls is also decreased. As a method of carrying out an ink affinity-imparting treatment without decreasing the ink repellency of the partition walls e.g. by UV cleaning, Patent Document 2 proposes a method of protecting the partition walls with a resin. Further, Patent Document 3 proposes use of a siloxane compound having a specific structure as a UV ozone-resistant resin.

Therefore, a negative photosensitive resin composition for formation of partition walls of an optical device, having ink repellency capable of withstanding an ink affinity-imparting treatment such as UV ozone cleaning and at the same time capable of forming dots excellent in the ink wettability, has been desired. As an attempt to accomplish these objects, e.g. Patent Document 4 discloses a technique relating to a negative photosensitive resin composition using, as an ink repellent, a fluorine-containing hydrolyzed condensate obtainable by combining three types of hydrolyzable silane compounds each having a specific structure.

PRIOR ART DOCUMENTS

Patent Documents

Patent Document 1: WO2004/079454
Patent Document 2: JP-A-2002-22933
Patent Document 3: WO2007/132892
Patent Document 4: WO2010/013816

DISCLOSURE OF INVENTION

Technical Problem

However, if partition walls for e.g. a color filter, an organic EL display device or an organic TFT array are prepared by using the photosensitive resin composition disclosed in Patent Document 1, so-called edge leakage is likely to take place wherein the thickness of the ink layer in the vicinity of partition walls becomes thin, and the periphery of the partition walls look white.

The method disclosed in Patent Document 2 is complicated since a step of removing the resin is required.

In the case of the photosensitive resin composition disclosed in Patent Document 3, there may be a problem in the adhesion to a substrate since it is a positive composition.

In the case of the photosensitive resin composition disclosed in Patent Document 4, there may be a case where the storage stability becomes insufficient since silanol groups in the ink repellent are reacted with each other and separated from the ink repellent.

It is an object of the present invention to provide a negative photosensitive resin composition which is excellent in storage stability and can be used for production of partition walls capable of maintaining excellent ink repellency even after an ink affinity-imparting treatment, and a production process thereof, and an ink repellent solution which can be used for the production process.

It is another object of the present invention to provide partition walls for an optical device obtainable by using the above negative photosensitive resin composition and their production process.

It is still another object of the present invention to provide a process for producing an optical device having partition walls obtained by using the above negative photosensitive resin composition, in which edge leakage or the like is suppressed.

Solution to Problem

The present inventors have found that a negative photosensitive resin composition containing a specific ink repellent and a specific solvent is excellent in storage stability. Further, the present inventors have found that by using the negative photosensitive resin composition to form partition walls, ink affinity is imparted to dots without decreasing the initial ink repellency of the partition walls e.g. by UV ozone treatment, and accomplished the present invention.

The present invention provides a negative photosensitive resin composition having the following constitutions [1] to [8], partition walls for an optical device having the following constitution [9], a process for producing partition walls for an optical device having the following constitution [10], a process for producing an optical device having the following constitutions [11] to [14], and an ink repellent solution having the following constitution [15].

[1] A negative photosensitive resin composition comprising an ink repellent (A) made of a fluorosiloxane compound having a hydroxy group bonded to a silicon atom and containing fluorine atoms in a proportion of from 10 to 55 mass % based on the total amount of the compound, a photosensitive resin (B) having an acidic group and an ethylenic double bond in one molecule, a photopolymerization initiator (C) and a solvent (D), wherein the proportion of the ink repellent (A) is from 0.01 to 10 mass % based on the total solid content of the composition, and the proportion of the hydroxy groups bonded to a silicon atom derived from the ink repellent (A) is from 0.000001 to 1.0 mmol/g based on the total amount of the composition.

[2] The negative photosensitive resin composition according to [1], wherein the proportion of the silicon atoms derived from the ink repellent (A) is from 0.000001 to 1.0 mmol/g based on the total amount of the composition.

[3] The negative photosensitive resin composition according to [1] or [2], wherein the number of the hydroxy groups bonded to a silicon atom in the ink repellent (A) is from 0.2 to 3.5 on average per silicon atom.

[4] The negative photosensitive resin composition according to any one of [1] to [3], wherein the solvent (D) is made of a solvent containing, as a main component, an organic solvent selected from the following (1) to (3):

(1) a $C_{3-10}$ hydrocarbon (excluding an alicyclic hydrocarbon) which has a hydroxy group and which may have etheric oxygen, (2) a $C_{6-10}$ alicyclic hydrocarbon having a hydroxy group, and (3) an organic solvent having a relative dielectric constant of from 10 to 30 and having no hydroxy group.

[5] The negative photosensitive resin composition according to any one of [1] to [4], wherein the fluorosiloxane compound is a partially hydrolyzed condensate of one or more hydrolysable silane compounds (provided that at least one of them has a fluoroorganic group) having p (wherein p is 0, 1 or 2) organic group(s) which may have a fluorine atom and (4-p) hydrolysable groups bonded to a silicon atom.

[6] The negative photosensitive resin composition according to [5], wherein the fluoroorganic group which the hydrolyzable silane compound has is an organic group having a $C_{4-8}$ perfluoroalkyl group or a $C_{4-9}$ perfluoroalkyl group containing an etheric oxygen atom.

[7] The negative photosensitive resin composition according to [5] or [6], wherein the hydrolyzable silane compound contains at least one member selected from the compounds represented by the following formula (a1) and at least one member selected from the compounds represented by the following formula (a2):

$$R^F—SiX_3 \quad (a1)$$

$$(R^H)_p—SiX_{(4-p)} \quad (a2)$$

in the formulae (a1) and (a2), the symbols are as follows:

$R^F$ is an organic group having a $C_{3-10}$ perfluoroalkyl group which may contain an etheric oxygen atom;

$R^H$ is a hydrocarbon group;

X is a hydrolysable group, and p is 0, 1 or 2;

when each compound has a plurality of $R^H$s or Xs, the plurality of these groups independently represent the groups and they may be the same or different from each other.

[8] The negative photosensitive resin composition according to any one of [1] to [7], which further contains a radical crosslinking agent (E) having at least two ethylenic double bonds and having no acidic group.

[9] Partition walls for an optical device comprising a substrate, and a plurality of pixels and partition walls located between the adjacent pixels formed on the substrate, which partition walls are made of a cured product of a composition obtained by removing the solvent (D) from the negative photosensitive resin composition as defined in any one of [1] to [8].

[10] A process for producing partition walls for an optical device comprising a substrate, and a plurality of pixels and partition walls located between the adjacent pixels formed on the substrate, which comprises a step of applying the negative photosensitive resin composition as defined in any one of [1] to [8] on the substrate to form a coating film of the composition, a prebaking step of heating the coating film to remove the solvent (D), an exposure step of exposing only a portion to be the partition walls of the coating film made of a composition having the solvent (D) removed to carry out photo-curing, a development step of removing the coating film other than the photo-cured portion to form partition walls made of the photo-cured portion of the coating film, and a post-baking step of heating the formed partition walls in this order.

[11] A process for producing an optical device comprising a substrate, and a plurality of pixels and partition walls located between the adjacent pixels formed on the substrate, which comprises forming partition walls on the substrate by the production process as defined in [10], and injecting an ink within regions surrounded by the substrate and the partition walls by means of an ink jet method to form the pixels.

[12] The process for producing an optical device according to [11], which comprises applying an ink affinity-imparting treatment to the surface of the substrate exposed to regions surrounded by the substrate and the partition walls, after the partition walls are formed and before the ink is injected.

[13] The process for producing an optical device according to [12], wherein the ink affinity-imparting treatment is one or more selected from the group consisting of UV cleaning, UV ozone cleaning, excimer cleaning, corona discharge treatment and oxygen plasma treatment.

[14] The process for producing an optical device according to any one of [11] to [13], wherein the optical device is an organic EL display device, a color filter or an organic TFT array.

[15] An ink repellent solution in which an ink repellent made of a fluorosiloxane compound having a hydroxy group bonded to a silicon atom and containing fluorine atoms in a proportion of from 10 to 55 mass % based on the total amount of the compound, is dissolved in a solvent containing, as a main component, an organic solvent having a relative dielectric constant of at least 5.

Advantageous Effects of Invention

According to the negative photosensitive resin composition and its production process, and the negative photosensitive resin composition using the ink repellent solution of the present invention, excellent storage stability can be obtained, and it is possible to produce partition walls which can maintain excellent ink repellency even after an ink affinity-imparting treatment.

The partition walls for an optical device of the present invention can maintain excellent ink repellency even after an ink affinity-imparting treatment.

According to the process for producing partition walls for an optical device of the present invention, it is possible to obtain partition walls which can maintain excellent ink repellency even after an ink affinity-imparting treatment.

According to the process for producing an optical device of the present invention, it is possible to obtain an optical device in which the color mixing between pixels, edge leakage, etc. are suppressed.

BRIEF DESCRIPTION OF DRAWING

FIG. 1 is a cross-sectional view schematically illustrating one example of the process for producing partition walls for an optical device of the present invention.

DESCRIPTION OF EMBODIMENTS

Now, the present invention will be described in detail. In this specification, unless otherwise specified, % represents mass %.

Further, the negative photosensitive resin composition of the present invention is a composition containing the solvent (D), and a composition having the solvent (D) removed from the negative photosensitive resin composition will be referred to as "a photosensitive composition". Moreover, a coating film (that is, a film of the negative photosensitive resin composition) containing the solvent (D), formed by applying the former negative photosensitive resin composition on e.g. a substrate, will be referred to as a wet coating film, and a film (that is, a film of the photosensitive composition) having the solvent (D) removed from the wet coating film will be referred to as "a photosensitive film". One having the photosensitive composition as a material to constitute the photosensitive film exposed to light and cured, will be referred to as a photo-cured product (one having the photosensitive cured product further post-cured by e.g. heating will be also referred to as a photo-cured product).

<Negative Photosensitive Resin Composition of the Present Invention>

The negative photosensitive resin composition of the present invention is a negative photosensitive resin composition comprising an ink repellent (A) made of a fluorosiloxane compound having a hydroxy group bonded to a silicon atom and containing fluorine atoms in a proportion of from 10 to 55 mass % based on the total amount of the compound, a photosensitive resin (B) having an acidic group and an ethylenic double bond in one molecule, a photopolymerization initiator (C) and a solvent (D), wherein the proportion of the ink repellent (A) is from 0.01 to 10 mass % based on the total solid content of the composition, and the proportion of the hydroxy groups bonded to a silicon atom derived from the ink repellent (A) is from 0.000001 to 1.0 mmol/g based on the total amount of the composition.

In the negative photosensitive resin composition of the present invention, an ink repellent made of a fluorosiloxane compound (fluorine atom content: from 10 to 55 mass %) having a hydroxy group bonded to a silicon atom, i.e. a silanol group, is blended so that the proportion of the silanol group is within the above range, and further the solvent contained in the negative photosensitive resin composition has a dielectric constant within a specific range or a specific structure, whereby the negative photosensitive resin composition has excellent storage stability. Moreover, it is possible to obtain partition walls by using the negative photosensitive resin composition, of which the initial ink repellency is improved, and at the same time, of which deterioration of the ink repellency by e.g. subsequent UV ozone treatment can be prevented.

In a conventional ink repellent, not only a fluorine-containing group having ink repellency but also a group having poor ink repellency from the viewpoint of molecular design, are present as groups derived from the ink repellent (A), on the upper surface of partition walls, but in the present invention, such a group having poor ink repellency is substituted with a silanol group, whereby the ink repellency is improved. Further, in a negative photosensitive resin composition, when the ink repellent (A) has a silanol group, its compatibility with other components such as the above photosensitive resin (B) improves, and therefore it is advantageous to form partition walls.

Now, the components contained in the negative photosensitive resin composition of the present invention and the ink repellent solution of the present invention will be described.

[Ink Repellent (A)]

The ink repellent (A) is made of a fluorosiloxane compound having a hydroxy group bonded to a silicon atom, i.e.

a silanol group, and containing fluorine atoms in a proportion of from 10 to 55 mass % based on the total amount of the compound.

A fluorosiloxane compound constituting the ink repellent (A) is not particularly limited so long as it is a fluorosiloxane compound having a silanol group and containing fluorine atoms in a proportion of from 10 to 55 mass %. Further, the number of the silanol groups in the ink repellent (A) is preferably from 0.2 to 3.5 on average per silicon atom.

Such a fluorosiloxane compound may, for example, be a partially hydrolyzed condensate of hydrolyzable silane compounds, satisfying the above conditions. The partially hydrolyzed condensate of hydrolyzable silane compounds is usually a composition having a molecular weight distribution itself. The partially hydrolyzable condensate of hydrolyzable silane compounds, to be used for the ink repellent (A) is a liquid or a solvent-soluble solid at room temperature, satisfying the above conditions, and it is preferably a curable silicone (i.e. a curable organopolysiloxane compound) usually called silicone resin.

The curable silicone is obtainable by hydrolytic condensation of a trifunctional monomer and a bifunctional monomer and in some cases, a small amount of a tetrafunctional monomer or a monofunctional monomer is used in combination. The number for functionality means the number of hydrolyzable groups bonded to one silicon atom and in some cases, the sum of the number of such hydrolyzable groups and the number of hydroxy groups (silanol groups) and the number of bonds capable of being silanol groups and the like bonded to one silicon atom. A monomer means a hydrolyzable silane compound (monomer).

The ink repellent (A) is specifically preferably a curable silicone which is a partially hydrolyzed condensate of one or more hydrolyzable silane compounds (provided that at least one of them has a fluoroorganic group) having p (wherein p is 0, 1 or 2) organic group(s) which may have a fluorine atom and (4-p) hydrolyzable groups bonded to a silicon atom, and which satisfies the above conditions.

The above organic group having a fluorine atom i.e. a fluoroorganic group is preferably an organic group having a $C_{3-10}$ perfluoroalkyl group which may have an etheric oxygen atom, more preferably an organic group having a $C_{4-8}$ perfluoroalkyl group or a $C_{4-9}$ perfluoroalkyl group containing an etheric oxygen atom. By suitably selecting the type or the number of the fluoroorganic groups to be introduced, the content of fluorine atoms based on the total amount of the compound is adjusted to be from 10 to 55 mass %.

It is more preferred that the ink repellent (A) comprises a curable silicone obtainable by hydrolytic condensation of at least two monomers, the two monomers respectively selected from the after-mentioned hydrolyzable silane compound (a-1) and hydrolyzable silane compound (a-2). The curable silicone has a fluoroorganic group so that the content of fluorine atoms based on the total amount of the silicone would be from 10 to 55 mass %, further has preferably from 0.2 to 3.5 silanol groups on average per silicon atom, and has a hydrocarbon group in some cases. Such an organic group means one having a bond of a carbon atom as the bond to be bonded to the silicon atom.

The hydrolyzable silane compound (a-1) is a trifunctional monomer having an organic group having one $C_{3-10}$ perfluoroalky group which may contain an etheric oxygen atom. Such hydrolyzable silane compounds (a-1) may be used alone or as a mixture of two or more in combination.

The hydrolyzable silane compound (a-2) is a (4-p)-functional monomer having p (wherein p is 0, 1 or 2) hydrocarbon group(s). The hydrolyzable silane compound (a-2) is preferably a tetrafunctional monomer wherein p is 0 or a trifunctional monomer wherein p is 1. Such hydrolyzable silane compounds (a-2) may be used alone or as a mixture of two or more in combination. When two or more are used in combination, a bifunctional monomer may be used in combination with the tetrafunctional monomer and/or the trifunctional monomer.

The hydrolyzable silane compounds (a-1) and (a-2) as starting material components to obtain the partially hydrolyzed condensate to be used in the present invention are, as represented by chemical formulae, respectively a compound [hereinafter referred to as compound (a1)] represented by the following formula (a1) and a compound [hereinafter referred to as compound (a2)] represented by the following formula (a2).

$$R^F\text{—}SiX_3 \qquad (a1)$$

$$(R^H)_p\text{—}SiX_{(4-p)} \qquad (a2)$$

In the above formulae (a1) and (a2), the symbols are as follows:

$R^F$ is an organic group having a $C_{3-10}$ perfluoroalkyl group which may contain an etheric oxygen atom;

$R^H$ is a hydrocarbon group;

X is a hydrolyzable group; and p is 0, 1 or 2.

In the formula (a1), 3 X groups may be the same or different from one another. In the formula (a2), when p=2, 2 $R^H$ groups may be the same or different from each other, and 2 X groups may be the same or different from each other. In the same manner, when p=0, 4 X groups may be the same or different from one another, and when p=1, 3 X groups may be the same or different from one another. When p=2, 2 X groups may be the same or different from each other.

The groups $R^F$ and the group $R^H$ in the repellent (A) to be used in the present invention are groups to exhibit water repellency, and the oil repellency is exhibited mainly by the group $R^F$. It is considered that a cured product of the ink repellent (A) exhibits sufficient oil repellency because of the presence of the group $R^F$ bonded to a silicon atom to which no group $R^H$ which impairs the oil repellency is bonded. Further, in order that a cured product of the ink repellent (A) may exhibit sufficient oil repellency, the relative proportion of the groups $R^F$ is preferably high based on the total amount of the groups $R^F$ and the groups $R^H$ in the ink repellent (A). When p=0, there is such an advantage that the relative proportion of the group $R^F$ in the ink repellent (A) is high, thus leading to an improvement in the oil repellency and excellent film-forming property. When p=1 or 2, there is such an advantage that since the groups $R^H$ are present to a certain extent, the ink repellent (A) is easily soluble in a hydrocarbon solvent, and accordingly a relatively inexpensive solvent can be selected when a wet coating film of the negative photosensitive resin composition is formed on the surface of a substrate.

The ink repellent (A) in the present invention has a fluorine atom content of from 10 to 55 mass %, preferably from 20 to 55 mass %, in order that excellent ink repellency and the ink repellency resistant to the UV ozone are imparted to partition walls obtainable from the negative photosensitive resin composition containing it. From the same viewpoint, in the ink repellent (A), it is most preferred that the organic group which the hydrolyzable silane compound (a-1) has is an organic group having a $C_{4-8}$ perfluoroalkyl group or a $C_{4-9}$ perfluoroalkyl group containing an etheric oxygen atom, and has a fluorine atom content of from 10 to 55 mass %.

In this specification, the fluorine atom content is a value calculated from a chemical formula assuming that all hydrolyzable groups in the hydrolyzable silane compounds as starting materials are converted to siloxane bonds to constitute a hydrolyzed condensate.

Further, in order to achieve the above fluorine atom content or the above preferred conditions of the ink repellent (A), it is necessary to adjust the structures, the combination, etc. of the hydrolyzable silane compound (a-1) and the hydrolyzable silane compound (a-2) as starting material components for the ink repellent (A), which will be described hereinafter.

The partially hydrolyzed condensate to be used in the present invention may also be a co-condensate of a silicon type hydrolyzable monomer not classified into the hydrolyzable silane compound (a-1) or (a-2) with the hydrolyzable silane compounds (a-1) and (a-2).

The silicon type hydrolyzable monomer other than the hydrolyzable silane compounds (a-1) and (a-2) may, for example, be a monofunctional hydrolyzable silane compound having three hydrocarbon groups and one hydrolyzable group bonded to a silicon atom, an organodisiloxane capable of being a monofunctional siloxane unit such as hexamethyldisiloxane, a cyclic organopolysiloxane such as octamethylcyclotetrasiloxane, or a hydrolyzable silane compound having a functional group-containing organic group called a silane coupling agent (excluding the above hydrolyzable silane compounds (a-1) and (a-2)).

Among them, as the silicon type hydrolyzable monomer other than the above hydrolyzable silane compounds (a-1) and (a-2), it is particularly preferred to use a monofunctional hydrolyzable silane compound (a-3) or an organodisiloxane (a-4) which functions as a molecular weight modifier for the resulting hydrolyzed condensate, in combination with the hydrolyzable silane compounds (a-1) and (a-2). The monofunctional hydrolysable silane compound (a-3) or the organodisiloxane (a-4) may be a hydrolysable silane compound having a polymerizable functional group such as an acryloyl group or a methacryloyl group.

The monofunctional hydrolyzable silane compound (a-3) may be preferably a hydrolyzable silane compound [hereinafter referred to as compound (a3)] represented by the following formula (a3), and the organodisiloxane (a-4) may be preferably an organodisiloxane [hereinafter referred to as compound (a-4)] represented by the following formula (a-4). These are silane compounds capable of forming monofunctional siloxane units.

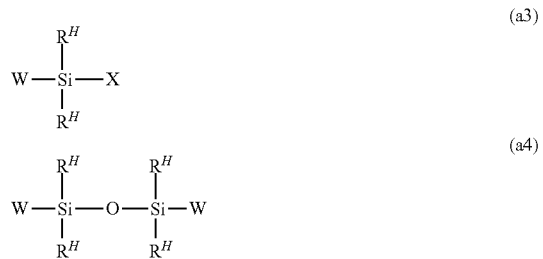

In the above formulae (a3) and (a4), the symbols X and $R^H$ are the same as X and $R^H$ in the above formulae (a1) and (a2). In the formulae (a3) and (a4), W independently represents the above $R^F$, $R^H$ or an organic group having at least one polymerizable functional group selected from an acryloyl group and a methecryloyl group, as a partial structure. In the formula (a4), W's may be the same or different from each other. In the formula (a3), two $R^H$'s (when W is $R^H$, three $R^H$'s) may be the same or different from each other, and in the formula (a4), four $R^H$'s (when W is $R^H$, 5 or 6 $R^H$'s) may be the same or different from one another.

In a case where the ink repellent (A) is obtained from the hydrolyzable silane compounds (a-1) and (a-2) and the monofunctional hydrolyzable silane compound (a-3) or the organodisiloxane (a-4) in combination, by using a monofunctional hydrolyzable silane compound (a3) or an organodisiloxane (a4) wherein W is $R^F$, the relative proportion of the groups $R^F$ in the ink repellent (A) is increased, thus leading to more excellent oil repellency, although it depends on the types and the amounts of the hydrolyzable silane compounds (a-1) and (a-2). Likewise, by using compounds wherein W is $R^H$, the solubility of the ink repellent (A) in a hydrocarbon solvent will be improved. Further, by using compounds wherein W is an organic group having at least one polymerizable functional group selected from an acryloyl group and a methecryloyl group as a partial structure, the curability of the ink repellent (A) will be improved and the solubility in a hydrocarbon solvent will be improved.

Further, when a hydrolyzable silane compound (a-5) having a polymerizable functional group such as an acryloyl group or a methacryloyl group, as a silicon type hydropyzable monomer other than the above hydrolyzable silane compounds (a-1) and (a-2), is co-condensed with the hydrolyzable silane compounds (a-1) and (a-2), the resulting ink repellent (A) is likely to remain on the upper surface of partition walls after the exposure, and therefore it is effective to impart ink repellency to the upper surface of the partition walls and ink affinity to the side surface of the partition walls.

On the other hand, when such a hydrolyzable silcane compound having a polymerizable functional group is not used as a co-condensation component for a starting material of the above partially hydrolyzable condensate preferably constituting the ink repellent (A), the ink repellent easily moves to the side surface of the partition walls after the exposure, and therefore it is effective to impart ink repellency to both of the upper surface and the side surface of the partition walls. These compounds may be properly used depending on the use.

As the above hydrolyzable silane compound (a-5) having a polymerizable functional group such as an acryloyl group or a methacryloyl group, a hydrolyzable silane compound [hereinafter referred to as compound (a-5)] represented by the following formula (a-5) may preferably be mentioned.

In the above formula (a5), the symbols X and $R^H$ are the same as X and $R^H$ in the above formula (a1) and (a2). In the formula (a5), V is an organic group having a polymerizable functional group selected from an acryloyl group and a methacryloyl group. q is 1 or 2, r is 0 or 1, and q+r is 1 or 2. Further, in the formula (a5), when q=2, two V groups may be the same or different from each other, when q+r=1, three X groups may be the same or different from one another, and when q+r=2, two X groups may be the same or different from each other.

The hydrolyzable silane compound (a-5) is preferably a bifunctional monomer wherein q is 1 and r is 1, or a trifunctional monomer wherein q is 1 and r is 0. Further, when the hydrolyzable silane compound (a-5) is used, it may be used alone or as a mixture of two or more in combination.

Moreover, also in a case where the above monofunctional hydrolyzable silane compound (a-3), organodisiloxane (a-4) or hydrolyzable silane compound (a-5) having a polymerizable functional group, as the above starting material component for a hydrolyzable condensate preferably constituting the ink repellent (A), is used in combination with the hydrolyzable silane compounds (a-1) and (a-2), it is necessary to adjust the structures, the combination, etc. of the above silane compounds (a-1) to (a-5) as starting material components for the ink repellent (A), in order to achieve the above fluorine atom content and the above preferred conditions of the ink repellent (A). It will be described hereinafter.

Now, the compounds (a1) to (a5) will be described in further detail with reference to specific examples.

X which the compounds (a1) to (a5) have is a hydrolyzable group, such as an organic group having a hydrogen atom of a hydroxy group removed from a monoalcohol, a halogen atom, an acyl group, an isocyanate group or an organic group having a hydrogen atom of an amino group removed from an amine compound. X is preferably an alkoxy group having at most 4 carbon atoms or a halogen atom, more preferably $CH_3O-$, $C_2H_5O-$ or $Cl-$. Such a group (X) is converted to a hydroxy group (a silanol group) by a hydrolytic reaction, and further reacts intermolecularly to form a $Si-O-Si$ bond (i.e. a siloxane bond).

$R^F$ which the compound (a1) has and which the compounds (a3) and (a4) optionally have, is preferably a group represented by $R^{F1}-Y-$. Here, $R^{F1}$ is a $C_{3-10}$ perfluoroalkyl group which may contain an etheric oxygen atom, and Y is a bivalent connecting group containing no fluorine atom.

$R^{F1}$ is preferably a $C_{4-8}$ perfluoroalkyl group or a $C_{4-9}$ perfluoroalkyl group containing an etheric oxygen atom, more preferably a $C_6$ perfluoroalkyl group. When $R^{F1}$ is such a group, partition walls formed by using the negative photosensitive resin composition of the present invention have excellent ink repellency and ink repellency resistant to UV ozone, and are excellent in solubility in a general purpose solvent.

The structure of $R^{F1}$ may be a linear structure, a branched structure, a cyclic structure or a structure partially having a ring, and is preferably a linear structure in the present invention.

As specific examples of $R^{F1}$, the following groups may be mentioned.

$F(CF_2)_4-$, $F(CF_2)_6-$, $F(CF_2)_8-$.
$CF_3CF_2OCF_2CF_2OCF_2-$,
$CF_3CF_2OCF_2CF_2OCF_2CF_2-$,
$CF_3CF_2OCF_2CF_2OCF_2CF_2OCF_2CF_2OCF_2-$,
$CF_3CF_2OCF_2CF_2OCF_2CF_2OCF_2CF_2OCF_2CF_2-$.

$CF_3CF_2CF_2OCF_2-$, $CF_3CF_2CF_2OCF_2CF_2-$, $CF_3CF_2CF_2OCF(CF_3)-$, $CF_3CF_2CF_2OCF(CF_3)CF_2-$, $CF_3CF_2CF_2OCF(CF_3)CF_2OCF_2CF_2-$, $CF_3CF_2CF_2OCF(CF_3)CF_2OCF(CF_3)-$, $CF_3CF_2CF_2OCF(CF_3)CF_2OCF(CF_3)CF_2-$.

The above Y is not particularly limited so long as it is a bivalent connecting group, and is preferably a group represented by $-(CH_2)_g-$, $-CH_2-O-(CH_2)_g-$, $-SO_2NR^2-(CH_2)_g-$ or $-(C=O)-NR^2-(CH_2)_g-$, wherein g is an integer of from 1 to 5, and $R^2$ is a hydrogen atom, a methyl group or an ethyl group. Y is particularly preferably $-(CH_2)_g-$ wherein g is 2 or 3. The direction of the group Y means that Si is bonded to the right side and $R^{F1}$ is bonded to the left side.

In a case where $R^{F1}$ is a $C_{4-8}$ perfluoroalkyl group, Y is preferably a group represented by $-(CH_2)_g-$. g is preferably an integer of from 2 to 4, and particularly preferred is $-(CH_2)_2-$ wherein g is 2.

In a case where $R^{F1}$ is a $C_{4-9}$ perfluoroalkyl group containing an etheric oxygen atom, Y is preferably a group represented by $-(CH_2)_h-$, $-CH_2-O-(CH_2)_h-$, $-SO_2NR^2-(CH_2)_h-$ or $-(C=O)-NR^2-(CH_2)_h-$, wherein h is an integer of from 1 to 5, and $R^2$ is a hydrogen atom, a methyl group or an ethyl group. Y is particularly preferably $-(CH_2)_2-$ wherein h is 2. The direction of the bond of the group Y means that Si is bonded to the right side and $R^{F1}$ is bonded to the left side.

$R^H$ which the compounds (a2), (a3), (a4) and (a5) have is preferably a $C_{1-4}$ alkyl group or a phenyl group, more preferably a methyl group or an ethyl group, particularly preferably a methyl group.

V which the compound (a5) has, is preferably a group represented by $V^1-Z-$, wherein $V^1$ is a (meth)acryloyloxy group, and Z is $-(CH_2)_3-$, $-(CH_2)_4-$, $-(CH_2)_5-$ or $-(CH_2)_6-$, preferably $-(CH_2)_3-$. Further, a polymerizable functional group selected from an acryloyl group and a methecryloyl group which the compounds (a3) and (a4) optionally have, is preferably the same group.

As specific examples of the compound (a1), the following examples are preferred.
$F(CF_2)_4CH_2CH_2Si(OCH_3)_3$,
$F(CF_2)_6CH_2CH_2Si(OCH_3)_3$,
$F(CF_2)_8CH_2CH_2Si(OCH_3)_3$,
$CF_3CF_2CF_2OCF(CF_3)CF_2OCF_2CF_2CH_2CH_2Si(OCH_3)_3$.

As specific examples of the compound (a2), the following examples are preferred.
$Si(OCH_3)_4$, $Si(OCH_2CH_3)_4$, $CH_3Si(OCH_3)_3$,
$CH_3Si(OCH_2CH_3)_3$, $CH_3CH_2Si(OCH_3)_3$,
$CH_3CH_2Si(OCH_2CH_3)_3$, $(CH_3)_2Si(OCH_3)_2$,
$(CH_3)_2Si(OCH_2CH_3)_2$.

As specific examples of the compound (a3), the following examples are preferred.
$[F(CF_2)_6CH_2CH_2](CH_3)_2Si(OCH_3)$, $(CH_3)_3Si(OCH_3)$, $[CH_2=C(CH_3)COO(CH_2)_3](CH_3)_2Si(OCH_3)$.

As specific examples of the compound (a4), the following example is preferred.
$(CH_3)_3SiOSi(CH_3)_3$ As specific examples of the compound (a5), the following examples are preferred.
$CH_2=C(CH_3)COO(CH_2)_3Si(OCH_3)_3$,
$CH_2=C(CH_3)COO(CH_2)_3Si(OCH_2CH_3)_3$,
$CH_2=CHCOO(CH_2)_3Si(OCH_3)_3$,
$CH_2=CHCOO(CH_2)_3Si(OCH_2CH_3)_3$,
$[CH_2=C(CH_3)COO(CH_2)_3]CH_3Si(OCH_3)_2$,
$[CH_2=C(CH_3)COO(CH_2)_3]CH_3Si(OCH_2CH_3)_2$.

The ink repellent (A) is a reaction product obtainable by reacting the above respective compounds. This reaction relates to formation of silanol groups by hydrolytic reaction of hydrolyzable groups and formation of a siloxane bond by dehydration condensation of the silanol groups. A molecular design of the ink repellent (A) to be used for the negative photosensitive resin composition of the present invention is carried out so that the silanol groups produced by the above hydrolytic reaction remain in a partially hydrolyzable condensate thus obtainable, and the number of such silanol groups is preferably from 0.2 to 3.5 on average per silicon atom.

For example, in a case where the ink repellent (A) is produced by using the hydrolyzable silane compound (a-1) and the hydrolyzable silane compound (a-2), the co-condensation ratio of the respective monomers i.e. the hydrolyzable silane compound (a-1) and the hydrolyzable silane compound (a-2) to be used is not particularly limited so long as the above fluorine atom content can be obtained, and the amount of the hydrolyzable silane compound (a-2) is preferably from 0.1 to 9 mol per 1 mol of the hydrolyzable silane compound (a-1). The amount of the hydrolyzable silane compound (a-2) is more preferably from 0.5 to 9 mol per 1 mol of the hydrolyzable silane compound (a-1). The ink repellent (A) contains the groups $R^F$ derived from the hydrolyzable silane compound (a-1), and the groups $R^F$ have a property to segregate on the surface of a photosensitive film. Accordingly, by introducing a small amount of the groups $R^F$, in other words, units derived from the hydrolyzable silane compound (a-1) to the ink repellent (A), the surface of a film obtained by curing the photosensitive composition will exhibit water repellency and oil repellency. If the groups $R^F$ are excessively introduced to the ink repellent (A), the solubility in a general purpose solvent may be impaired.

In preparation of the ink repellent (A), in a case where a silane compound capable of forming a monofunctional siloxane unit such as the monofunctional hydrolyzable silane compound (a-3) or the organodisiloxane (a-4) is used in addition to the hydrolyzable silane compounds (a-1) and (a-2), the amount of the monofunctional hydrolyzable silane compound (a-3) or the organodisiloxane (a-4) is preferably at most 100 mol %, particularly preferably at most 10 mol % based on the total number of mols of the hydrolyzable silane compounds (a-1) and (a-2). However, in a case where only the organodisiloxane (a-4) is used, the above amount is preferably at most 50 mol %, particularly preferably at most 5 mol %.

Further, in preparation of the ink repellent (A), in a case where the hydrolysable silane compound (a-5) having a polymerizable functional group is used in addition to the hydrolyzable silane compounds (a-1) and (a-2) (and further the monofunctional hydrolyzable silane compound (a-3) or the organodisiloxane (a-4) may optionally be used), the amount of the hydrolysable silane compound (a-5) having a polymerizable functional group is preferably at most 100 mol %, particularly preferably at most 50 mol % based on the total number of mols of the hydrolyzable silane compounds (a-1) and (a-2).

The ink repellent (A) in the present invention may be constituted by a single compound but is usually a mixture constituted by a plurality of compounds differing in the degree of polymerization, etc. That is, in a case where the ink repellent (A) is produced by using e.g. the hydrolyzable silane compound (a-1) and the hydrolyzable silane compound (a-2) as essential components and the monofunctional hydrolyzable silane compound (a-3) and/or the organodisiloxane (a-4) as optional components, it is one having a structure of an average compositional formula represented by the following formula (1). However, the ink repellent (A) is practically a product (a partially hydrolyzed condensate) in which a hydrolyzable group or a silanol group remains, and such a product is hardly represented by a chemical formula, and the average compositional formula represented by the following formula (1) is a chemical formula assuming that all hydrolyzable groups and silanol groups are converted to siloxane bonds by further reaction of the above produced partially hydrolyzed condensate.

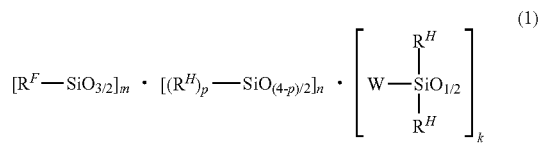

(1)

In the formula, $R^F$, $R^H$, W and p, are as defined in the above formulae (a1) to (a4), each of m and n is an integer of at least 1, and k is 0 or an integer of at least 1.

In the partially hydrolyzed condensate having a structure of an average compositional formula represented by the above formula (1), the monomer units derived from the respective compounds (a1) and (a2) are estimated to be randomly arranged, and the monomer units derived from the compound (a3) and/or the compound (a4) optionally blended therein are estimated to be positioned at the terminal of the molecular chain. With respect to the values of m and n, m:n as an average value in the entire ink repellent (A) is preferably such that the proportion of the amount of the hydrolyzable silane compound (a-2) to the hydrolyzable silane compound (a-1) is within the above-described range. Further, with respect to the value of k, (m+n):k as an average value in the entire ink repellent (A) is preferably within the above-described range, that is, k is preferably at most 1, particularly preferably at most 0.1 based on the value of (m+n) of 1.

Further, in a case where the ink repellent (A) is produced by using e.g. the hydrolyzable silane compound (a-1) and the hydrolyzable silane compound (a-2) as essential components, and the hydrolyzable silane compound (a-5) having a polymerizable functional group such as an acryloyl group or a methacryloyl group as an optional component, and the hydrolyzable silane compound (a-3) and/or the organodisiloxane (a-4) as optional components, it is one having a structure of an average compositional formula represented by the following formula (2). However, the ink repellent (A) is practically a product (a partially hydrolyzed condensate) in which a hydrolyzable group or a silanol group remains, and such a product is hardly represented by a chemical formula, and the average compositional formula represented by the following formula (2) is a chemical formula assuming that all hydrolyzable groups and silanol groups are converted to siloxane bonds in the above produced hydrolyzed condensate.

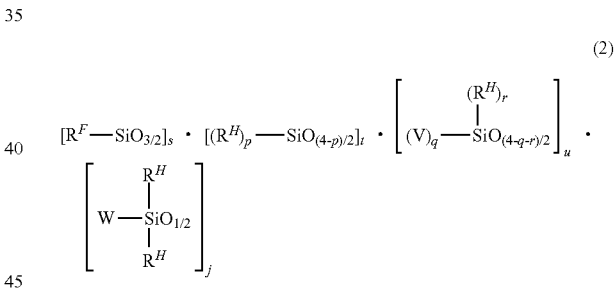

(2)

In the formula, $R^F$, $R^H$, V, W, p, q and r are as defined in the above formulae (a1), (a2) and (a5), each of s and t is an integer of at least 1, and each of u and j is 0 or an integer of at least 1.

In the hydrolyzed condensate having a structure of an average compositional formula represented by the above formula (2), like the hydrolyzed condensate represented by the above formula (1), the monomer units derived from the respective compounds (a1) and (a2) and the compound (a5) optionally blended therein are estimated to be randomly arranged, and the monomer units derived from the compound (a-3) and/or the compound (a-4) optionally blended therein are estimated to be positioned at the terminal of the molecular chain. With respect to the values of s and t, s:t as an average value in the entire ink repellent (A) is preferably such that the proportion of the amount of the hydrolyzable silane compound (a-2) to the hydrolyzable silane compound (a-1) is within the above-described range. Further, with respect to the value of u, (s+t):u as an average value in the entire ink repellent (A) is preferably within the above-described range, that is, u is preferably at most 1, more preferably at most 0.5, particularly preferably at most 0.1 based on the value of (s+t)

of 1. Moreover, with respect to the value of j, (s+t+u):j as an average value in the entire ink repellent (A) is preferably within the above-described range, that is, j is preferably at most 1, particularly preferably at most 0.1 based on the value of (s+t+u) of 1.

Here, the number of silanol groups in the fluorosiloxane compound, preferably in the partially hydrolyzed condensate, constituting the ink repellent (A) in the present invention, is preferably from 0.2 to 3.5 on average per silicon atom, as mentioned above. When the number of silanol groups in the fluorosiloxane compound is at most 3.5 on average, there is a merit in that evaporation of the ink repellent (A) from the surface of a substrate can be prevented at the time of forming partition walls by using a negative photosensitive resin composition containing it. When the number of silanol groups in the fluorosiloxane compound is at least 0.2 on average per silicon atom, there is a merit in that the workability improves since the solubility of the ink repellent (A) in a solvent and the compatibility of the ink repellent (A) with other components in a negative photosensitive resin composition will be good. Further, the number of silanol groups in the fluorosiloxane compound is more preferably from 0.2 to 2.0, furthermore preferably from 0.5 to 1.5 on average per silicon atom.

The number of silanol groups in the fluorosiloxane compound is calculated from peak area ratios derived from various structures which have or do not have silanol groups measured by $^{29}$Si-NMR. The number of silanol groups on average per silicon atom in the fluorosiloxane compound can be calculated by the following method, in the case of e.g. the number of silanol groups on average per silicon atom in the hydrolyzed condensate.

(Calculation of Number of Silanol Groups on Average)

Peaks measured by $^{29}$Si-NMR have a specific chemical shift range in each of the following molecular structures.

In an organopolysiloxane compound such as a curable silicone, a unit derived from a tetrafunctional hydrolyzable silane compound is called Q unit, a unit derived from a trifunctional hydrolyzable silane compound is called T unit, a unit derived from a difunctional hydrolyzable silane compound is called D unit, and a unit derived from a monofunctional hydrolyzable silane compound is called M unit.

Four connecting bonds of a silicon atom in each unit are a connecting bond bonded to the above-mentioned organic group by a silicon-carbon bond or a connecting bond bonded by a silicon-oxygen bond. In a case where a hydrolyzable group remains without being hydrolyzed and further a terminal of the hydrolyzable group is e.g. an amino group, the connecting bond may be a silicon-nitrogen bond. In the case of silicon-oxygen bond, when an oxygen atom thereof is further boned to another silicon atom, this silicon-oxygen bond is a siloxane bond.

In the case of a partially hydrolyzed condensate in the present invention, four connecting bonds of a silicon atom in each unit are substantially composed of connecting bonds as a silicon-carbon bond and connecting bonds of a silicon-oxygen bond. The connecting bond of a silicon-oxygen bond is a connecting bond of a bond in a hydroxy group bonded to a silicon atom or a bond (siloxane bond) bonded to an adjacent silicon atom via an oxygen atom. The number of remaining hydrolyzable groups is considered to be negligible.

Here, a structure of the Q unit in a partially hydrolyzed condensate is classified into the following five types depending upon the number of siloxane bonds. Here, Q0 is not a unit of a polymer but a hydrolysate (not a condensate) of a monomer. However it may be incorporated into a partially hydrolyzed condensate in some cases, and therefore Q0 is regarded as one of the Q units.

Q0: $(HO)_4Si$
Q1: $(HO)_3SiO_{1/2}$
Q2: $(HO)_2SiO_{2/2}$
Q3: $(HO)SiO_{3/2}$
Q4: $SiO_{4/2}$

Hydroxy groups (silanol groups) in Q0 to Q3 are a group which is not subjected to condensation after a hydrolyzable group of a tetrafunctional hydrolyzable silane compound is formed into a silanol group by hydrolysis. In the Q units, Q0 to Q4 are measured as different peaks by $^{29}$Si-NMR, and on the basis of the measurement results, the number of silanol groups on average derived from Q units is calculated by the following calculation formula regarding the peak area ratio of each unit as the number of units.

Number of silanol groups on average derived from Q unit= (number of Q0 unit×4+number of Q1 unit×3+number of Q2 unit×2+number of Q3 unit×1)/(number of Q0 unit+number of Q1 unit+number of Q2 unit+number of Q3 unit+number of Q4 unit)

Likewise, the structure of a T unit is classified into the following four types depending upon the number of siloxane bonds. R is an organic group bonded to a silicon atom by a silicon-carbon bond (hereinafter the same also applies to a D unit and a M unit). T0 is not a unit of a polymer but a hydrolysate (not a condensate) of a monomer. However, it may be incorporated into a partially hydrolyzed condensate in some cases, and therefore it is regarded as one of the T units.

T0: $R(HO)_3Si$
T1: $R(HO)_2SiO_{1/2}$
T2: $R(HO)SiO_{2/2}$
T3: $RSiO_{3/2}$

In the T units, T0 to T3 are measured as different peaks by $^{29}$Si-NMR, and on the basis of the measurement results, the number of silanol groups on average derived from the T unit is calculated by the following formula regarding the peak area ratio of each unit as the number of units.

Number of silanol groups on average derived from T unit= (number of T0 unit×3+number of T1 unit×2+number of T2 unit×1)/(number of T0 unit+number of T1 unit+number of T2 unit+number of T3 unit)

Likewise, the structure of a D unit is classified into the following three types depending on the number of siloxane bonds. Here, D0 is not a unit of a polymer but a hydrolysate (not a condensate) of a monomer. However, D0 may be incorporated into a partially hydrolyzed condensate in some cases, and therefore it is regarded as one of the D units. Two Rs bonded to a silicon atom may be different.

D0: $R_2(HO)_2Si$
D1: $R_2(HO)SiO_{1/2}$
D2: $R_2SiO_{2/2}$

In D units, D0 to D2 are measured as different peaks by $^{29}$Si-NMR, and on the basis of the measurement results, the number of silanol groups on average derived from the D units is calculated by the following formula regarding the peak area ratio of each unit as the number of units.

Number of silanol groups on average derived from D units=(number of D0 units×2+number of D1 units×1)/(number of D0 units+number of D1 units+number of D2 units)

Likewise, the structure of M units is classified into the following two types depending upon the number of siloxane bonds. Here, M0 is not a unit of a polymer but a hydrolysate (not a condensate) of a monomer. However, M0 may be incorporated into a partially hydrolyzed condensate in some cases, and therefore it is regarded as one of the M units. Three Rs bonded to a silicon atom may be different from one another.

M0: $R_3(HO)Si$
M1: $R_3SiO_{1/2}$

In the M unit, M0 and M1 are measured as different peaks by $^{29}$Si-NMR, and on the basis of the measurement results, the number of silanol groups on average derived from the M units is calculated by the following formula regarding the peak area ratio of each unit as the number of units.

Number of silanol groups on average derived from M units=(number of M0 units)/(number of M0 units+number of M1 units)

Further, the number of silanol groups on average per silicon atom in the partially hydrolyzed condensate is calculated from peak area ratios by $^{29}$Si-NMR measurement, derived from structural units of the above Q units, T units, D units and M units.

Total number of silanol groups on average=(number of Q0 units×4+number of Q1 units×3+number of Q2 units×2+number of Q3 units×1+number of T0 units×3+number of T1 units×2+number of T2 units×1+number of D0 units×2+number of D1 units×1+number of M0 units×1)/(number of Q0 units+number of Q1 units+number of Q2 units+number of Q3 units+number of Q4 units+number of T0 units+number of T1 units+number of T2 units+number of T3 units+number of D0 units+number of D1 units+number of D2 units+number of M0 units+number of M1 units)

The number of silanol groups in the partially hydrolyzed condensate can be adjusted by changing the proportion of a solvent which stabilizes a silanol group. Further, in the case of the negative photosensitive resin composition of the present invention, the proportion of the solvent (D) contained together with the ink repellent (A), as a solvent which stabilizes a silanol group, is adjusted. The solvent which stabilizes a silanol group will be described in detail in the after-mentioned solvent (D). Here, the number of silanol groups in the hydrolyzed condensate may be adjusted by using the above monofunctional hydrolyzable silane compound (a-3) or the organodisiloxane (a-4), but if a hydrocarbon group bonded to a silicon atom is present, the ink repellency tends to deteriorate, and therefore it is preferred that the number of silanol groups is adjusted by using the solvent which stabilizes a silanol group.

The number average molecular weight of the curable silicone as the ink repellent (A) in the present invention is preferably at least 500, and preferably less than 1,000,000, more preferably less than 10,000. When the number average molecular weight is at least 500, there is a merit in that evaporation from the surface of a substrate can be prevented at the time of forming partition walls by using a negative photosensitive resin composition containing it, and when the number average molecular weight is less than 1,000,000, there is a merit in that the workability improves since the solubility in a solvent becomes good. The number average molecular weight of the curable silicone as the ink repellent (A) can be adjusted by selecting the reaction conditions, etc.

Further, the molecular weight can be adjusted by changing the proportion of the solvent which stabilizes a silanol group, as well as the adjustment of the above number of silanol groups. The solvent which stabilizes a silanol group will be mentioned below. Thus, the number of silanol groups and the molecular weight are considered to have an interrelation. The upper limit of the molecular weight can be adjusted by using the monofunctional hydrolyzable silane compound (a-3) or the organodisiloxane (a-4), whereby the storage stability of the curable silicone obtainable by the reaction can be improved. However, if a hydrocarbon group bonded to a silicon atom is present, the ink repellency tends to deteriorate, and therefore it is preferred to carry out the adjustment by using a solvent which stabilizes a silanol group. Further, the number average molecular weight is a value measured by means of gel permeation chromatography using polystyrene as the standard substance. Hereinafter, the number average molecular weight disclosed in this specification is a value measured by this measurement method.

<Production of Ink Repellent (A) and Ink Repellent Solution of the Present Invention>

For the reaction of hydrolysis and condensation of e.g. the hydrolyzable silane compound (a-1) and the hydrolyzable silane compound (a-2), and the monofunctional hydrolyzable silane compound (a-3), the organosiloxane (a-4) and the hydrolyzable silane compound (a-5) having a polymerizable functional group such as an acryloyl group or a methacryloyl group optionally added to obtain a fluorosiloxane compound, preferably the above partial hydrolyzed condensate, which constitutes the ink repellent (A), reaction conditions to be usually employed for a common reaction of hydrolytic condensation of a hydrolyzable silane compound can be applied without any particularly restriction.

In some cases, a polyfunctional hydrolyzable silane compound may preliminarily be hydrolyzed and condensed to some extent, and then reacted with another hydrolyzable silane compound. Especially, a tetrafunctional hydrolyzable silane compound can be used for the reaction as it is preliminarily hydrolyzed and condensed to some extent, and further a partially hydrolyzed condensate of a commercially available tetrafunctional hydrolyzable silane compound can be used as a part of or instead of the tetrafunctional hydrolyzable silane compound. The partially hydrolyzed condensate of a commercially available tetrafunctional hydrolyzable silane compound may, for example, be a partially hydrolyzed condensate of tetramethoxysilane (for example, "methyl silicate 51" (tradename) manufactured by COLCOAT CO., LTD.) or a partially hydrolyzed condensate of tetraethoxysilane (for example, "ethyl silicate 40", "ethyl silicate 48" (tradenames) manufactured by COLCOAT CO., LTD.).

Further, for the reaction of hydrolytic condensation of such a hydrolyzable silane compound, it is preferred to use, as a catalyst, an inorganic acid such as hydrochloric acid, sulfuric acid, nitric acid or phosphoric acid, or an organic acid such as acetic acid, oxalic acid or maleic acid, to be usually used. The amount of the catalyst to be used is specifically from 0.01 to 10 mass %, preferably from 0.1 to 1 mass %, based on the total amount of the hydrolyzable silane compound (a-1) and the hydrolyzable silane compound (a-2), and the monofunctional hydrolyzable silane compound (a-3), the organodisiloxane (a-4) and the hydrolyzable silane compound (a-5) having a polymerizable functional group such as an acryloyl group or a methacryloyl group, optionally added, to be used for the reaction.

[Solvent (D2) of Ink Repellent]

A solvent to be used for the hydrolytic condensation reaction to obtain the ink repellent (A) is blended in the form of an ink repellent solution, into the negative photosensitive resin composition of the present invention. Accordingly, a reaction solvent for the ink repellent is a solvent having, as a main component, an organic solvent with a relative dielectric constant of at least 5. Further, as such an organic solvent, it is preferred to use a solvent having a relative dielectric constant of at least 5 in which hydrolyzed silane compounds, a hydrolytic condensate, water needed for hydrolysis and a catalyst are dissolved. Further, it is more preferred to use a solvent having a relative dielectric constant of at least 5 and at most 30. Further, the solvent (D2) may or may not contain water as a result of adding the water. It is preferred that water is not contained therein.

Such a solvent may be an alcohol such as methanol, ethanol, 1-propanol, 2-propanol, 1-butanol, 2-butanol, isobutanol, 2-methyl-2-propanol, ethylene glycol, glycerol or propylene glycol; a ketone such as acetone, methyl isobutyl ketone or cyclohexanone; an ester such as methyl acetate, ethyl acetate or propylene glycol monomethyl ether acetate; a monoalkyl ether of ethylene glycol such as 2-methoxyethanol or 2-ethoxyethanol; a monoalkyl ether of diethylene glycol such as 2-(2-methoxyethoxy)ethanol, 2-(2-ethoxyethoxy) ethanol or 2-(2-butoxyethoxy)ethanol, a monoalkyl ether of propylene glycol such as propylene glycol monomethyl ether, a monoalkyl ether of dipropylene glycol such as dipropylene glycol monomethyl ether, or a monoalkyl ether of other glycols. In addition, benzyl alcohol, N,N-dimethylformamide, dimethylsulfoxide, dimethylacetamide, or N-methylpyrrolidone may, for example, be mentioned. They may be used alone or as a mixture of two or more in combination.

Further, a non-organic solvent having a relative dielectric constant of at least 30 per se may be used in combination with or added to a solvent having a relative dielectric constant of at least 5 per se, thereby to increase a stabilization effect of a silanol group. Such a non-organic solvent may be water (∈: 76.73 (30° C.)).

The above solvent (D2) to be used for the hydrolytic condensation reaction to obtain the ink repellent (A) may be a combination of the above solvent in which water and a catalyst are dissolved, and a non-water soluble solvent in which the hydrolyzable silane compounds and a partially hydrolyzed condensate are dissolved. It is preferred that the solvent and the nonwater-soluble solvent in which the hydrolyzable silane compounds and a partially hydrolyzed condensate are dissolved, are miscible with one another. As a combination of such solvents, specifically, isopropyl alcohol with hexane, isopropyl alcohol with dichloropentafluoropropane (AK-225 (tradename) manufactured by Asahi Glass Company, Limited, a mixture of $CF_3CF_2CHCl_2$ and $CClF_2CF_2CHClF$), or isopropyl alcohol with toluene, may, for example, be mentioned. When these solvents are used, it is preferred to adjust the dielectric constant of a mixed solvent to be at least 5.

As the amount of the solvent to be used, specifically, the solvent may be used so that the amount of the hydrolyzable silane compound would be from 0.01 to 10 mass %, preferably from 0.1 to 1.0 mass %, based on the total amount of the negative photosensitive resin composition containing a solvent in a case where a hydrolyzable silane compound to be used for reaction is composed of the hydrolyzable silane compound (a-1) and the hydrolyzable silane compound (a-2), the monofunctional hydrolyzable silane compound (a-3), the organodisiloxane (a-4) and the hydrolyzable silane compound (a-5) having a polymerizable functional group such as an acryloyl group or a methacryloyl group, optionally added. Usually, an ink repellent solution is used in an amount of from 0.1 to 50 mass % as a solid content concentration.

The reaction is preferably carried out under proper stirring conditions at a temperature of from room temperature to the boiling point of the solvent. The reaction time specifically depends on the amounts of the starting material components used, the reaction temperature, the stirring conditions, etc. and is approximately from 0.5 to 24 hours, preferably from 1 to 10 hours. After the completion of the reaction, the reaction product may be added to the negative photosensitive resin composition of the present invention without removing the solvent. So long as the stability of silanol groups is maintained, the solvent may be removed by a conventional method to obtain the ink repellent (A), and then the ink repellent (A) may be added to the negative photosensitive resin composition, but usually the solvent used for the reaction is not removed to obtain an ink repellent solution.

A reaction product thus obtainable, i.e. a partially hydrolyzed condensate, is usually blended as the ink repellent (A), into the negative photosensitive resin composition of the present invention, in a form of a solution of the ink repellent (A), together with the solvent to be used in this reaction. In such a case, the solvent to be used in the reaction constitutes a part of the solvent (D) of the negative photosensitive resin composition. Accordingly, as a solvent to be used in production of a hydrolyzed condensate, it is preferred to use the solvent which stabilizes the silanol groups.

Here, the partially hydrolyzed condensate may be produced in a different solvent, and thereafter the solvent may be replaced by a solvent which stabilizes silanol groups. A solvent to be used in such a case may be selected from the above solvents mentioned as solvents to be used for the reaction of an ink repellent.

Further, as mentioned above, so long as the stability of the silanol groups can be maintained, one having a solvent removed can be blended into the negative photosensitive resin composition together with a solvent silanol groups. A solvent to be used in such a case may be selected from the above solvents mentioned as solvents to be used for the reaction of an ink repellent.

The ink repellent solution of the present invention is a solution to be used for blending the ink repellent in a state where the silanol groups which the ink repellent has are stabilized, together with other constituents, in production of the after-mentioned negative photosensitive resin composition of the present invention.

That is, the ink repellent solution of the present invention is characterized in that an ink repellent made of a fluorosiloxane compound having a hydroxy group bonded to a silicon atom and containing fluorine atom in a proportion of from 10 to 55 mass % based on the total amount of the compound, is dissolved in a solvent having a relative dielectric constant of at least 5. Here, as the ink repellent, it is possible to use the ink repellent (A) as explained above. Further, the solvent having a relative dielectric constant of at least 5 may be a solvent containing, as a main component, an organic solvent having a relative dielectric constant of at least 5, as explained above. As a content of the ink repellent (A) in the solution, a proportion being from 0.01 to 10 mmol/g as a concentration of hydroxy groups (silanol groups) bonded to a silicon atom may be mentioned.

Further, as another embodiment of the ink repellent solution, the present invention provides an ink repellent solution containing an ink repellent made of a fluorosiloxane compound having a hydroxy group bonded to a silicon atom and containing fluorine atoms in a proportion of from 10 to 55 mass % based on the total amount of the compound in a proportion of from 0.01 to 10 mmol/g in the solution, as a concentration of hydroxy groups (silanol groups) bonded to a silicon atom, from the viewpoint of partition wall formability, the solubility of the ink repellent (A) in a solvent or compatibility with other components in a negative photosensitive resin composition. As the above concentration of silanol groups, the proportion is more preferably from 0.01 to 10 mmol/g. Here, as the ink repellent, it is possible to use the ink repellent (A) as explained above. Further, the solvent which dissolves the ink repellent may be preferably a solvent having a relative dielectric constant of at least 5, specifically preferably a solvent containing, as a main component, an organic solvent having a relative dielectric constant of at least 5.

Here, the concentration (mmol/g) of hydroxy groups (silanol groups) bonded to a silicon atom derived from the ink repellent (A) in the solution can be measured and calculated by the following method. That is, a solution (provided that a solvent of the solution is a solvent having the above relative dielectric constant) containing the ink repellent (A) is subjected to $^{29}$Si-NMR measurement to measure the amount of silanol groups contained in the solution. Then, the amount of silanol groups on average per silicon atom derived from the ink repellent (A) is calculated by the above method. From the concentration (which can be calculated from a charge value) of silicon atoms in the solution used for the measurement, the concentration of the silanol groups in the solution is calculated.

The proportion of the ink repellent (A) which the negative photosensitive resin composition of the present invention contains is from 0.01 to 10 mass %, preferably from 0.1 to 1 mass %, based on the total solid content of the negative photosensitive resin composition. Here, the total solid content means a component to form partition walls among components contained in the negative photosensitive resin composition, and means all the components other than volatile components, such as a solvent (D), which volatilize by e.g. heating in a step of forming partition walls. Further, a composition as the total solid content is a photosensitive composition of the present invention.

Further, the above proportion is a value calculated assuming that all hydrolyzable groups in the hydrolyzable silane compounds as starting materials are converted to siloxane bonds to constitute a hydrolyzed condensate. By the proportion of the ink repellent (A) within such a range, partition walls for an optical device obtainable from the negative photosensitive resin composition of the present invention will have good ink repellency and have a smooth surface.

In addition to the above, the proportion of the ink repellent (A) which the negative photosensitive resin composition of the present invention contains is such that the proportion of hydroxy groups bonded to a silicon atom derived from the ink repellent (A) is from 0.000001 to 1.0 mmol/g, preferably from 0.000005 to 0.5 mmol/g based on the total amount of the composition. By the proportion of hydroxy groups bonded to a silicon atom derived from the ink repellent (A) within such a range, the volatility can be prevented, and the solubility in the composition also becomes good.

The proportion of silicon atoms derived from the ink repellent (A) is preferably from 0.000001 to 1.0 mmol/g, more preferably from 0.000005 to 0.5 mmol/g based on the total amount of the negative photosensitive resin composition of the present invention, from the viewpoint of the liquid repellency and the UV ozone resistance.

Here, the concentration (mmol/g) of hydroxy groups (silanol groups) bonded to a silicon atom derived from the ink repellent (A) in the composition can be calculated from the concentration (mmol/g) of silanol groups in the solution and the concentration of the ink repellent (A) in the composition. The proportion (mmol/g) of silicon atoms can be calculated from the charge value of a silicon compound in the ink repellent (A) and the concentration of the ink repellent (A) in the composition.

Now, the photosensitive resin (B) which the negative photosensitive resin composition of the present invention contains will be described below.

[Photosensitive Resin (B)]

The photosensitive resin (B) which the negative photosensitive resin composition of the present invention contains is a photosensitive resin having an acidic group and an ethylenic double bond in one molecule. By the photosensitive resin (B) having an acidic group, the non-exposed portion of a film (that is, a photosensitive film) of a photosensitive composition formed from the negative photosensitive resin composition containing it will be removed by an alkali developer, and by it having an ethylenic double bond, the exposed portion of a photosensitive film formed from the negative photosensitive resin composition will be a photo-cured product being insoluble in an alkali developer and will not be removed by the alkali developer but will remain on the surface of a substrate, thus forming partition walls or the like for an optical device. The photosensitive resin (B) preferably contains substantially no perfluoroalkyl group.

The acidic group may be at least one acidic group selected from the group consisting of a carboxy group, a phenolic hydroxy group, a sulfonic acid group and a phosphoric acid group. Further, the acidic group is preferably a carboxy group. The ethylenic double bond may, for example, be an addition-polymerizable unsaturated group such as a (meth) acryloyl group, an allyl group, a vinyl group or a vinyl ether group, or a group having a part of or all the hydrogen atoms of such an addition-polymerizable unsaturated group substituted by a hydrocarbon group(s). The hydrocarbon group is preferably a methyl group.

The photosensitive resin (B) may, for example, be specifically a polymer (B1) having a side chain containing an acidic group and a side chain containing an ethylenic double bond, which is a copolymer of an ethylenically unsaturated monomer containing an acidic group, an ethylenically unsaturated monomer containing a functional group capable of being bonded to a reactive group, and the like, or a resin (B2) having an ethylenic double bond and an acidic group introduced to an epoxy resin.

The above polymer (B1) may be obtained, for example, by preparing an ethylenically unsaturated monomer containing an acidic group, an ethylenically unsaturated monomer containing a functional group capable of being bonded to a reactive group, and the like by a conventional radical polymerization method, and reacting a compound containing a reactive group and a double bond to form a side chain having an ethylenic double bond.

The resin (B2) is preferably a compound obtained by reacting a reaction product of an epoxy resin with a compound containing a carboxy group and an ethylenic double bond, with a polybasic carboxylic acid or its anhydride.

The epoxy resin to be used for preparation of the resin (B2) may, for example, be specifically a bisphenol A type epoxy resin, a bisphenol F type epoxy resin, a phenol novolac type epoxy resin, a cresol novolac type epoxy resin, a trisphenol methane type epoxy resin, an epoxy resin having a naphthalene skeleton, an epoxy resin having a biphenyl skeleton represented by the following formula (B21) (wherein s is an integer of from 1 to 50, preferably from 2 to 10), or an epoxy resin represented by the following formula (B22) (wherein each of $R^7$, $R^8$, $R^9$ and $R^{19}$ which are independent of one another, is a hydrogen atom, a chlorine atom or a $C_{1-5}$ alkyl group, and they may be the same or different from one another, and t is an integer of from 0 to 10).

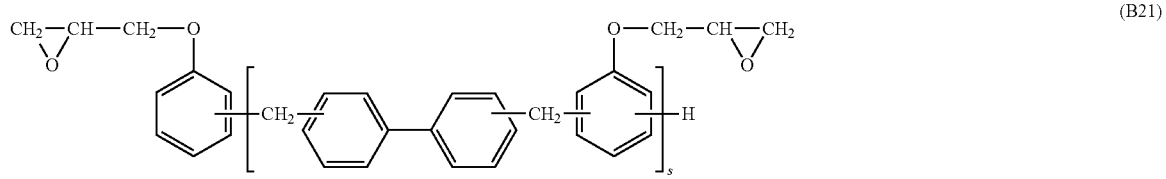

(B21)

(B22)

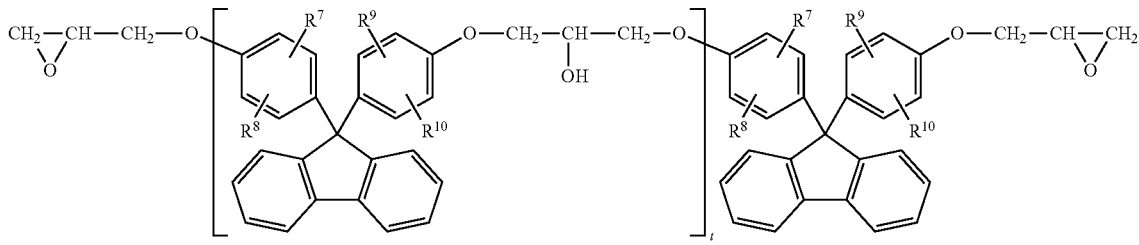

An ethylenic double bond is introduced to an epoxy resin by reacting a compound containing a carboxy group and an ethylenic double bond with the epoxy resin. Further, by reacting a polybasic carboxylic acid or its anhydride therewith, it is possible to introduce a carboxy group as an acidic group.

Commercial products of the resin (B2) having an acidic group and an ethylenic double bond introduced to the epoxy resin may, for example, be KAYARAD PCR-1069, K-48C, CCR-1105, CCR-1115, CCR-1163H, CCR-1166H, CCR-1159H, TCR-1025, TCR-1064H, TCR-1286H, ZAR-1535H, ZFR-1122H, ZFR-1124H, ZFR-1185H, ZFR-1492H, ZCR-1571H, ZCR1569H, ZCR-1580H, ZCR1581H, ZCR1588H and CCR-1159 (all manufactured by Nippon Kayaku Co., Ltd.).

In the negative photosensitive resin composition of the present invention, the photosensitive resin (B) preferably has at least three ethylenic double bonds in one molecule, more preferably at least 6 ethylenic double bonds in one molecule. It is thereby possible that the difference in alkali solubility may readily be made between an exposed portion and a non-exposed portion of a photosensitive film formed from the obtainable photosensitive resin composition, and it becomes possible to form a fine pattern with less light exposure.

The photosensitive resin (B) preferably has a carboxy group and/or a hydroxy group as a crosslinkable group. The negative photosensitive resin composition of the present invention further contains a heat crosslinking agent (F) which is a compound having at least two groups reactive with a carboxy group and/or a hydroxy group in some cases as described hereinafter. In such a case, when the photosensitive resin (B) contains a carboxy group and/or a hydroxy group as a crosslinkable group, the photosensitive resin (B) and the heat crosslinking agent (F) will undergo a crosslinking reaction by heat treatment after the development, whereby the crosslinked density of a photo-cured product will be increased, and the heat resistance will be improved. When the photosensitive resin (B) already has a carboxy group or a phenolic hydroxy group as an acidic group, such a group may function as the crosslinkable group. In a case where the photosensitive resin (B) has a sulfonic acid group, a phosphoric acid group or the like as the acidic group, it preferably has at least one group selected from a carboxy group, a phenolic hydroxy group and an alcoholic hydroxy group as the crosslinkable group.

The acid value of the photosensitive resin (B) is preferably from 10 to 300 mgKOH/g, more preferably from 30 to 150 mgKOH/g. Within such a range, the alkali solubility of the obtainable photosensitive resin composition will be good. Further, the acid value means milligram of potassium hydroxide required to neutralize e.g. the resin acid in 1 g of a sample, and is a value measured in accordance with a measuring method of JIS K 0070.

The number average molecular weight of the photosensitive resin (B) is preferably at least 500 and less than 20,000, more preferably at least 2,000 and less than 15,000. Within such a range, the difference in alkali solubility may readily be made between an exposed portion and a non-exposed portion of a photosensitive film formed from the photosensitive resin composition, and it becomes possible to form a fine pattern with less light exposure.

The negative photosensitive resin composition of the present invention may contain, as the photosensitive resin (B), one of compounds classified therein alone or may contain a mixture of two or more. Further, the proportion of the photosensitive resin (B) based on the total solid content of the negative photosensitive resin composition of the present invention is preferably from 5 to 80 mass %, more preferably from 10 to 60 mass %. Within such a range, the difference in alkali solubility may readily be made between an exposed portion and a non-exposed portion of a photosensitive film formed from the photosensitive resin composition, and it becomes possible to form a fine pattern with less light exposure.

Now, the photopolymerization initiator (C) which the negative photosensitive resin composition of the present invention contains will be described.

[Photopolymerization Initiator (C)]

The photopolymerization initiator (C) which the negative photosensitive resin composition of the present invention contains is not particularly limited so long as it is a compound having a function as a photopolymerization initiator, and is preferably a compound which generates radicals by light.

The photopolymerization initiator (C) may, for example, be an α-diketone such as benzyl, diacetyl, methylphenylglyoxylate or 9,10-phenanthrenequinone; an acyloin such as benzoin; an acyloin ether such as benzoin methyl ether, benzoin ethyl ether or benzoin isopropyl ether; a thioxanthone such as thioxanthone, 2-chlorothioxanthone, 2-methylthioxanthone, 2,4-dimethylthioxanthone, isopropylthioxanthone, 2,4-diethylthioxanthone, 2,4-dichlorothioxanthone, 2,4-diisopropylthioxanthone or thioxanthone-4-sulfonic acid; a benzophenone such as benzophenone, 4,4'-bis(dimethylamino)benzophenone or 4,4'-bis(diethylamino)benzophenone; an acetophenone such as acetophenone, 2-(4-toluenesulfonyloxy)-2-phenylacetophenone, p-dimethylaminoacetophenone, 2,2'-dimethoxy-2-phenylacetophenone, p-methoxyacetophenone, 2-methyl-[4-(methylthio)phenyl]-2-morpholino-1-propanone, or 2-benzyl-2-dimethylamino-1-(4-morpholinophenyl)-butan-1-one; a quinone such as anthraquinone, 2-ethylanthraquinone, camphorquinone or 1,4-naphthoquinone; an aminobenzoate such as ethyl 2-dimethylaminobenzoate, ethyl 4-dimethylaminobenzoate, (n-butoxy)ethyl 4-dimethylaminobenzoate, isoamyl 4-dimethylaminobenzoate or 2-ethylhexyl 4-dimethylaminobenzoate; a halogenated compound such as phenacyl chloride or trihalomethyl phenyl sulfone; an acylphosphine oxide; a peroxide such as di-t-butylperoxide; or an oxime ester such as 1,2-octanedione, 1-[4-(phenylthio)-, 2-(o-benzoyloxime) or ethanone 1-[9-ethyl-6-(2-methylbenzoyl)-9H-carbazoyl-3-yl]-1-(o-acetyloxime).

Particularly, the above-mentioned benzophenone, aminobenzoate or the like may be used together with another radical initiator to exhibit a sensitizing effect. Further, an aliphatic amine such as triethanolamine, methyldiethanolamine, triisopropanolamine, n-butylamine, N-methyldiethanolamine or diethylaminoethyl methacrylate may likewise be used together with a radical initiator to exhibit a sensitizing effect.

Further, in addition to the above, a thiol compound such as 2-mercaptobenzimidazole, 2-mercaptobenzoxazole, 2-mercaptobenzothiazole, 1,4-butanolbis(3-mercaptobutyrate), tris (2-mercaptopropanoyloxyethyl)isocyanurate or pentaerythritol tetrakis(3-mercaptobutyrate) may also be used together with a radical initiator to exhibit a synthesizing effect.

The negative photosensitive resin composition of the present invention may contain, as the photopolymerization initiator (C), one of compounds classified therein alone or may contain a mixture of two or more. Further, the proportion of the photopolymerization initiator (C) based on the total solid content of the negative photosensitive resin composition of the present invention is preferably from 0.1 to 50 mass %, more preferably from 0.5 to 30 mass %. Within such a range, photocurability of an exposed portion of a photosensitive film formed from the photosensitive resin composition becomes good, and it becomes possible to form a fine pattern with less light exposure.

Now, the solvent (D) which the negative photosensitive resin composition of the present invention contains will be described.

[Solvent (D)]

The solvent (D) which the negative photosensitive resin composition of the present invention contains, is not particularly limited so long as it has functions to uniformly dissolve or disperse the above ink repellent (A), the photosensitive resin (B), the photopolymerization initiator (C) and further after-mentioned optional components which the negative photosensitive resin composition contains, so that the negative photosensitive resin composition is uniformly and easily applied on a substrate on which partition walls are to be formed, and it is not reactive with these components, but it is preferably a solvent having functions to stabilize a silanol group in the ink repellent (A).

The solvent (D) is a solvent containing, as a main component, an organic solvent. The organic solvent is contained in an amount of preferably from 50 to 100 mass %, more preferably from 70 to 100 mass %, particularly preferably from 80 to 100 mass % in the solvent. Further, the organic solvent constituting the solvent (D) is selected from (1) a $C_{3-10}$ hydrocarbon (excluding an alicyclic hydrocarbon) which has a hydroxy group and which may have etheric oxygen, (2) a $C_{6-10}$ alicyclic hydrocarbon having a hydroxy group, and (3) an organic solvent having a relative dielectric constant of from 10 to 30 and having no hydroxy group.

The solvent (D) has a relative dielectric constant of preferably from 10 to 30, particularly preferably from 12 to 20.

(1) $C_{3-10}$ Hydrocarbon (Excluding an Alicyclic Hydrocarbon) which has a Hydroxy Group and which May have Etheric Oxygen The above hydrocarbon may, for example, be an alcohol such as ethanol, 1-propanol, 2-propanol, 1-butanol, 2-butanol, isobutanol, 2-methyl-2-propanol, glycerol or propylene glycol; a monoalkyl ether of ethylene glycol such as 2-methoxyethanol or 2-ethoxyethanol; a monoalkyl ether of diethylene glycol such as 2-(2-methoxyethoxy)ethanol, 2-(2-ethoxyethoxy)ethanol or 2-(2-butoxyethoxy)ethanol; a monoalkyl ether of propylene glycol such as propylene glycol monomethyl ether, a monoalkyl ether of dipropylene glycol such as dipropylene glycol monomethyl ether; a monoalkyl ether of another glycol, or benzyl alcohol. They may be used alone or as a mixture of two or more in combination.

(2) $C_{6-10}$ Alicyclic Hydrocarbon Having a Hydroxy Group

As a specific example of the above alicyclic hydrocarbon, 4-ethylcyclohexanol or 4-propylcyclohexanol may, for example, be mentioned. They may be used alone or as a mixture of two or more in combination.

(3) Organic Solvent Having a Relative Dielectric Constant of from 10 to 30 and Having No Hydroxy Group.

As a specific example of the above organic solvent, a ketone such as acetone ($\in$: 21.36 (25° C.)), methyl isobutyl ketone ($\in$: 13.11 (25° C.)) or cyclohexanone (Å: 16.02 (25° C.)) may, for example, be mentioned. They may be used alone or as a mixture of two or more in combination. Further, $\in$ represents a relative dielectric constant.

Solvents (1) to (3) may be used alone or as a mixture of two or more in combination. In a case where they are used in combination, a proportion of (1) in the solvent (D) is preferably at least 20 mass %, particularly preferably at least 50 mass %. Proportions of (2) and (3) in the solvent (D) are respectively preferably at most 80 mass %, particularly preferably at most 50 mass %.

Moreover, a solvent not included in the above (1) to (3) may further be used in combination. For example, an organic solvent having a relative dielectric exceeding 30 and having no hydroxy group, a $C_{1-2}$ hydrocarbon (excluding an alicyclic hydrocarbon) which has a hydroxy group and which may have an etheric oxygen atom, or water ($\in$: 76.73 (30° C.)) may be mentioned. When they are used in combination, it is possible to increase an effect of stabilizing a silanol group.

The organic solvent having a relative dielectric constant exceeding 30 and having no hydroxy group may, for example, be N,N-dimethylformamide ($\in$: 37.06 (25° C.)), dimethylsulfoxide ($\in$: 46.71 (25° C.)), dimethylacetamide ($\in$: 38.3 (25° C.)) or N-methylpyrrolidone ($\in$: 32.58 (20° C.)).

The $C_{1-2}$ hydrocarbon (excluding an alicyclic hydrocarbon) which has a hydroxy group and which may have an etheric oxygen atom, may, for example, be ethylene glycol ($\in$: 38.66 (25° C.)) or methanol ($\in$: 32.35 (25° C.)).

They may be used alone or as a mixture of two or more in combination. A proportion in the solvent (D) is preferably at most 30 mass %, particularly preferably at most 20%.

The solvent (D) which the negative photosensitive resin composition of the present invention contains, is one including a solvent which the ink repellent (A) solution contains, in a case where the ink repellent (A) is blended in the negative photosensitive resin composition in the form of a solution produced or a solution replaced by a solvent after the production. That is, in e.g. a case where the ink repellent (A) is blended in a form of a solution to produce a negative photosensitive resin composition, the solvent (D) is composed of a first solvent (D1) blended in the form of a solvent alone and a second solvent (D2) derived from the ink repellent solution. Further, in a case where the ink repellent (A) itself is blended in the above production, the solvent (D) is composed of the first solvent (D1) alone blended in the form of a solvent alone. In the present invention, in either case, it is preferred that the solvent (D) is made of a solvent containing, as a main component, an organic solvent having a relative dielectric constant of from 10 to 30.

The amount of the solvent (D) which the negative photosensitive resin composition of the present invention contains, is preferably such that the blend amount of the ink repellent (A) is from 0.01 to 10 mass % based on the total solid content of the composition, and further the total solid content in the composition is from 1 to 50 mass %, although it depends on the composition, the application, etc. of the negative photosensitive resin composition.

The above ink repellent (A), the photosensitive resin (B), the photopolymerization initiator (C) and the solvent (D) as essential components which the negative photosensitive resin composition of the present invention contains are explained respectively, and now, preferred blend compositions of these components in the negative photosensitive resin composition of the present invention will be described below.

The blend proportions of the ink repellent (A), the photosensitive resin (B), the photopolymerization initiator (C) and the solvent (D) in the negative photosensitive resin composition of the present invention are preferably such that the proportion of the photosensitive resin (B) is from 20 to 80 mass %, the proportion of the photopolymerization initiator (C), is from 0.1 to 50 mass % based on the total solid content of the negative photosensitive resin composition and the proportion of the solvent (D) is from 10 to 95 mass % based on the total amount of the negative photosensitive resin composition, under essential conditions where the proportion of hydroxy groups to be bonded to a silicon atom derived from the ink repellent (A) is from 0.000001 to 1.0 mmol/g, and further the content of the ink repellent (A) is from 0.01 to 10 mass % based on the total solid content of the negative photosensitive resin composition, depend on the type or combination of the respective components.

Further, it is more preferred that the proportion of the ink repellent (A) is from 0.1 to 1.0 mass %, the proportion of the photosensitive resin (B) is from 30 to 70 mass %, the proportion of the photopolymerization initiator (C) is from 1 to 10 mass % and the proportion of the solvent (D) is from 20 to 80 mass % while the proportion of silanol groups derived from the ink repellent (A) is secured to be within the above range.

Moreover, even when the negative photosensitive resin composition of the present invention contains optional components as mentioned below, it preferably contains the optional components while maintaining the preferred blend ratios of the ink repellent (A), the photosensitive resin (B), the photopolymerization initiator (C) and the solvent (D) within the above proportion.

It is usually required that in a case where the photosensitive resin composition of the present invention is stored in a refrigerator after the production, it has storage stability for at least about one month, that is e.g. the silanol concentration is within the above concentration range.

The components (A) to (D) which the negative photosensitive resin composition of the present invention contains as essential components were described above. However, the negative photosensitive resin composition of the present invention may contain various optional components in addition to these essential components. Now, optional components which the negative photosensitive resin composition of the present invention may contain will be described.

[Optional Components]

It is preferred that the negative photosensitive resin composition of the present invention further contains a radical crosslinking agent (E) having at least two ethylenic double bonds and having no acidic group, whereby the photocurability of the photosensitive resin composition further improves, and the formation of partition walls for an optical device with low exposure is accelerated.

As specific examples of the radical crosslinking agent (D), diethylene glycol di(meth)acrylate, tetraethylene glycol di(meth)acrylate, tripropylene glycol di(meth)acrylate, neopentyl glycol di(meth)acrylate, 1,9-nonanediol di(meth)acrylate, trimethylolpropane tri(meth)acrylate, pentaerythritol tri (meth)acrylate, pentaerythritol tetra(meth)acrylate, ditrimethylolpropane tetra(meth)acrylate, dipentaerythritol penta(meth)acrylate or dipentaerythritol hexa(meth)acrylate may be mentioned. Further, urethane acrylate may also be mentioned. They may be used alone, or two or more of them may be used in combination.

In the negative photosensitive resin composition of the present invention, the proportion of the radical crosslinking agent (E) based on the total solid content of the negative photosensitive composition is preferably from 10 to 60 mass %, more preferably from 15 to 50 mass %. Within such a range, the difference in alkali solubility may readily be made between an exposed portion and a non-exposed portion of a photosensitive film formed from the photosensitive resin composition, and it becomes possible to form a fine pattern with less light exposure.

It is preferred that the negative photosensitive resin composition of the present invention further contains a heat crosslinking agent (F) which is a compound having at least two groups reactive with a carboxy group and/or a hydroxy group. In a case where the photosensitive resin (B) has a carboxy group and/or a hydroxy group, the heat crosslinking agent (F) has a function to be reacted with the photosensitive resin (B), thus increasing the crosslinked density of the photocured product and improving the heat resistance.

The heat crosslinking agent (F) may be preferably at least one member selected from the group consisting of an amino resin, an epoxy compound, an oxazoline compound, a polyisocyanate compound and a polycarbodiimide compound. Such a compound may be used alone, or two or more of them may be used in combination.

The proportion of the heat crosslinking agent (F) based on the total solid content of the negative photosensitive composition of the present invention is preferably from 1 to 50 mass %, more preferably from 5 to 30 mass %. Within such a range, the developability of the obtainable photosensitive composition will be good.

In a case where the negative photosensitive resin composition of the present invention is used for formation of a black matrix which is a black portion in a lattice form surrounding three color pixels of R, G and B in a color filer of a liquid crystal display device, or it is used for formation of partition walls between pixels of an organic EL display device, it preferably contains a black colorant (G). By containing the black colorant (G), contrast becomes good. The black colorant (G) may, for example, be carbon black, aniline black, anthraquinone black pigment or perylene black pigment, specifically, C. I. Pigment Black 1, 6, 7, 12, 20 or 31. High-resistance carbon black surface-treated with e.g. a resin may also be mentioned.

The carbon black is preferably one having a specific surface area of from 50 to 200 m$^2$/g as measured by BET method, from the viewpoint of the black matrix shape. If carbon black having a specific surface area of less than 50 m$^2$/g is used, deterioration of the black matrix shape is likely to result, and if carbon black having a specific surface area exceeding 200 m$^2$/g is used, a dispersing aid is likely to be excessively adsorbed on the carbon black, whereby it will be required to incorporate a large amount of the dispersing agent in order to obtain various physical properties.

Further, the carbon black is preferably one having dibutyl phthalate oil absorption of at most 120 cc/100 g from the viewpoint of the sensitivity. The smaller the oil absorption, the better.

As the black colorant (G), it is also possible to use a black colorant (G) having at least two types of chromatic organic pigments such as a red pigment, a blue pigment, a green pigment and a yellow pigment blended and mixed so that the resulting mixture would be black, that is light having a wavelength in a visible region would be widely absorbed. As the chromatic organic pigment applicable in production of the black colorant (G), specifically, C. I. pigment blue 2, 3, 9, 15:1, 15:3, 15:6, 22, 25:4, 60, 61, 66 or 80, C. I. pigment red 7, 14, 41, 48:1, 48:2, 48:3, 48:4, 81:1, 81:2, 81:3, 81:4, 146, 177, 184, 185, 187, 200, 202, 208, 210, 246, 254, 255, 264, 270, 272 or 279, C. I. pigment green 7, 10, 36, 37 or 58, or pigment yellow 12, 13, 14, 17, 20, 24, 74, 83, 86, 93, 94, 109, 110, 117, 125, 137, 138, 139, 147, 148, 150, 153, 165, 166, 173 or 185 may, for example, be mentioned.

As the black colorant (G) obtainable as a mixture of such chromatic organic pigments, a combination of C.I. pigment blue 15:6, C. I. pigment red 254, C. I. pigment green 36 and C. I. pigment yellow 150 is preferred from the viewpoint of dispersibility and dispersion stability. The blend proportion of each organic pigment is not particularly limited so long as the colorant becomes black after the mixture.

In order to improve the dispersibility of the black colorant (G) in the negative photosensitive resin composition, it is preferred to incorporate a polymer dispersant. The polymer dispersant is preferably a compound having an acidic functional group or a basic functional group from the viewpoint of affinity to the black colorant (G). As the acidic functional group, a carboxy group, a sulfo group or a phosphoric group may be mentioned, and a carboxy group is preferred. The acid value of the polymer dispersant is preferably from 10 to 100 mgKOH/g. The basic functional group is particularly excellent in dispersibility when it has a primary, secondary or tertiary amino group.

As a polymer dispersant, a urethane type, a polyimide type, an alkyd type, an epoxy type, an unsaturated polyester type, a melamine type, a phenol type, an acrylic type, a vinyl chloride type, a vinyl chloride/vinyl acetate copolymer type, a polyamide type, or a polycarbonate type compound may be mentioned. Among them, a urethane type or a polyester type compound is particularly preferred.

The amount of the polymer dispersant is preferably from 5 to 30 mass %, particularly preferably from 10 to 25 mass % to the black colorant (G). When the amount is at least the lower limit in the above range, dispersion of the black colorant (G) becomes good, and when the amount is at most the upper limit of the above range, the developability becomes good.

In the negative photosensitive resin composition of the present invention, the black colorant (G) is usually blended as a dispersion of the black colorant (G) obtained by blending the black colorant (G) into a dispersion medium together with the polymer dispersant, followed by dispersion treatment. The dispersion of the black colorant (G) can be produced in such a manner that a mixture of the black colorant (G), the polymer dispersant, and the dispersion medium is dispersed by means of wet pulverizing by using a known wet pulverizing dispersion apparatus such as a paint conditioner or a beads mill. As the dispersion medium to be used, it is possible to use the same as the solvent (D) of the negative photosensitive resin composition. The dispersion medium blended into the negative photosensitive resin composition as a dispersion of the black colorant (G) constitutes a part of the solvent (D).

The blend amount of the dispersion medium in the dispersion is approximately from 65 to 90 mass % based on the total amount of the dispersion.

Further, the average primary particle size of the black colorant (G), observed by a transmission electron microscope, is preferably from 20 to 50 nm. If the average primary particle size is too small, it tends to be difficult to disperse it at a high concentration and it is thereby difficult to obtain a negative photosensitive resin composition having good stability with time. If the average primary particle size is too large, the shape of the black matrix is likely to deteriorate. Further, the average secondary particle size observed by a transmission electron microscope is preferably from 80 to 200 nm.

Further, as the dispersion of the black colorant (G), it is possible to use a commercial product. The commercial product may, for example, be DINA color mixing BM (manufactured by DIC Corporation, a mixture of black colorant (G) (color mixing black organic pigment): polymer dispersant: dispersion medium (propylene glycol 1-monomethyl ether 2-acetate (PGMEA)=15:4.5:80.5 as a mass ratio), or S2961 (manufactured by Dainichiseika Color & Chemicals Mfg. Co., Ltd., a mixture of black colorant (G) (azomethine type black pigment): polymer dispersant: dispersion medium (PGMEA)=12:7.2:80.8 as a mass ratio), as a trade name.

In a case where the black colorant (G) is incorporated in the negative photosensitive resin composition of the present invention to use the composition for e.g. formation of a black matrix, the proportion of the black colorant (G) based on the total solid content of the negative photosensitive resin composition is preferably from 1 to 50 mass %, more preferably from 20 to 40 mass %. Within such a range, the obtainable photosensitive composition will have good sensitivity, and partition walls to be formed are excellent in the light shielding properties.

It is preferred that the negative photosensitive resin composition of the present invention contains a silane coupling agent (H) as the case requires. When a silane coupling agent is used, the adhesion to the substrate of a photo-cured product obtainable is improved.

The silane coupling agent (H) may, for example, be specifically tetraethoxysilane, 3-glycidoxypropyltrimethoxysilane, methyltrimethoxysilane, vinyltrimethoxysilane, 3-methacryloxypropyltrimethoxysilane, 3-chloropropyltrimethoxysilane, 3-mercaptopropyltrimethoxysilane, 3-aminopropyltriethoxysilane, heptadecafluorooctylethyltrimethoxysilane, or a polyoxyalkylene chain-containing triethoxysilane. They may be used alone or two or more of them may be used in combination.

In the negative photosensitive resin composition of the present invention, the proportion of the silane coupling agent (H) is preferably from 0.1 to 20 mass %, more preferably from 1 to 10 mass % based on the total solid content. If the content is too low, the effect of improving the adhesion to the substrate of a photo-cured product obtainable will be low, and if the content is too high, the ink repellency may be impaired, such being undesirable.

To the negative photosensitive resin composition of the present invention, a curing accelerator, a thickener, a plasticizer, a defoaming agent, a leveling agent, an anti-repellent, an ultraviolet absorber, etc. may be incorporated, as the case requires.

<Process for Producing Negative Photosensitive Resin Composition of the Present Invention>

The negative photosensitive resin composition of the present invention can be prepared in such a manner that the ink repellent (A) is weighed so that its proportion will be from 0.01 to 10 mass %, preferably from 0.1 to 1 mass %, based on the total solid content in the negative photosensitive resin composition, further the content of silanol groups derived from the ink repellent (A) will be from 0.000001 to 1.0 mmol/g, preferably from 0.000005 to 0.5 mmol/g, the other components are weighed in the above-described appropriate amounts, and they are mixed and stirred by an appropriate method for appropriate time, specifically from about 30 to about 120 minutes. Further, the ink repellent (A) is blended so that the proportion of silicon atoms derived from the ink repellent (A) is preferably from 0.000001 to 1.0 mmol/g, more preferably from 0.000005 to 0.5 mmol/g based on the total amount of the negative photosensitive resin composition of the present invention.

Further, in the present invention, the negative photosensitive resin composition may be produced in such a manner that the ink repellent (A) is prepared as the following solution, and it is mixed with the photosensitive resin (B), the photopolymerization initiator (C) and the first solvent (D1), and such a process is preferably employed in the present invention. Further, also in such a case, the ink repellent (A) is blended so that its proportion is from 0.01 to 10 mass %, preferably from 0.1 to 1 mass % based on the total solid content of the negative photosensitive resin composition, and further the content of silanol groups derived from the ink repellent (A) is from 0.000001 to 1.0 mmol/g, preferably from 0.000005 to 0.5 mmol/g. Moreover, likewise, the ink repellent (A) is blended so that the proportion of silicon atoms derived from the ink repellent (A) is preferably from 0.000001 to 1.0 mmol/g, more preferably from 0.000005 to 0.5 mmol/g based on the total amount of the negative photosensitive resin composition of the present invention.

Ink repellent (A) solution: a solution having the ink repellent (A) made of a fluorosiloxane compound having a hydroxy group bonded to a silicon atom and containing fluorine atoms in a proportion of from 10 to 55 mass % based on the total amount of the compound, dissolved in the second solvent (D2), and containing the ink repellent (A) in a proportion of from 0.01 to 10 mmol/g as the concentration of hydroxy groups bonded to a silicon atom in the solution.

Here, such an ink repellent (A) solution may specifically be the above-mentioned ink repellent solution of the present invention.

The negative photosensitive resin composition of the present invention is used as a material for photolithography etc. in the same manner as a conventional negative photosensitive resin composition, and an obtainable photo-cured product can be used as a member for an optical device for which a photo-cured product obtainable by using a conventional negative photosensitive resin composition is employed. Particularly, it is preferred to use the negative photosensitive resin composition of the present invention for formation of partition walls for an optical device comprising a substrate, and a plurality of pixels and partition walls located between the adjacent pixels, formed on the substrate, whereby partition walls having sufficient ink repellency even after an ink affinity-imparting treatment such as UV ozone cleaning can be obtained.

The present invention further provides a process for producing such partition walls for an optical device using the negative photosensitive resin composition of the present invention. Now, the process for producing partition walls for an optical device of the present invention by photolithography using the negative photosensitive resin composition of the present invention will be described.
<Process for Producing Partition Walls for Optical Device Using Negative Photosensitive Resin Composition of the Present Invention>

The process for producing partition walls for an optical device of the present invention is applied to production of partition walls for an optical device comprising a substrate, and a plurality of pixels and partition walls located between the adjacent pixels formed on the substrate, and comprises a step of applying the negative photosensitive resin composition of the present invention on the substrate to form a coating film of the composition, a prebaking step of heating the coating film to remove the solvent (D), an exposure step of exposing only a portion to be the partition walls of the film of the composition excluding the solvent (D) for photo-curing, a development step of removing the film other than the photo-cured portion to form partition walls made of the photo-cured portion of the film, and a post-baking step of heating the formed partition walls in this order.

Further, the coating film formed in the step of forming the coating film is a wet coating film, the prebaking step is a step of removing the solvent (D) from the wet coating film by volatilization by heating to form a photosensitive film, and the film of a composition having the solvent (D) removed in the exposure step means this photosensitive film.

FIG. 1 is a drawing schematically illustrating one embodiment of the production process of the present invention. FIG. 1(I) is a drawing illustrating a cross section of a state where a photosensitive film 2 is formed on a substrate 1. The photosensitive film 2 is a film formed by removing a solvent from a wet coating film made of the negative photosensitive composition of the present invention. FIG. 1(II) is a drawing schematically illustrating the exposure step. FIG. 1(III) is a cross-sectional view illustrating the substrate 1 after the development step and partition walls 6 formed on the substrate. Now, the production process of the present invention will be specifically described with reference to FIG. 1.
(Coating Film Formation Step)

To form partition walls for an optical device, first, as the cross section is shown in FIG. 1(I), the negative photosensitive resin composition of the present invention is applied on a substrate 1 to form a wet coating film made of the negative photosensitive resin composition. As the substrate 1, its material is not particularly limited, and various glass sheets; a thermoplastic plastic sheet of e.g. polyester (such as polyethylene terephthalate), polyolefin (such as polyethylene or polypropylene), polycarbonate, polymethyl methacrylate, polysulfone, polyimide or a poly(meth)acrylic resin; or a cured sheet of a thermosetting resin such as an epoxy resin or an unsaturated polyester may, for example, be mentioned. Particularly from the viewpoint of the heat resistance, a glass sheet or a heat resistant plastic such as polyimide is preferably employed. Before formation of the wet coating film of the negative photosensitive resin composition on the substrate 1, it is preferred to clean the surface of the substrate 1 on which the negative photosensitive resin composition is to be applied, by alcohol cleaning, UV ozone cleaning or the like.

The method of forming the wet coating film of the negative photosensitive resin composition is not particularly limited so long as a coating film having a uniform thickness can be formed, and may be a method employed for conventional formation of a coating film, such as a spin coating method, a spraying method, a slit coating method, a roll coating method, a rotary coating method or a bar coating method. The thickness of the wet coating film is decided considering the height of the partition walls to be finally obtained. The film thickness of the wet coating film is approximately preferably from 0.3 to 325 μm, more preferably from about 1.3 to about 65 μm.
(Prebaking Step)

Then, the wet coating film formed on the substrate 1 in the above coating film formation step is heated. By this heating, the volatile component including the solvent contained in the negative photosensitive resin composition constituting the wet coating film, is volatilized and removed to obtain a non-adhesive photosensitive film. Further, the ink repellent (A) migrates to the vicinity of the surface of the film. The heating method may be a method of subjecting the wet coating film together with the substrate 1 to heat treatment by a heating apparatus such as a hot plate or an oven preferably at from 50 to 120° C. for from about 10 to about 2,000 seconds.

In the prebaking step, the solvent (D), and if other volatile components are present, such other volatile components are removed from the wet coating film, and the wet coating film becomes the photosensitive film 2.

Further, it is possible to remove the volatile component such as a solvent by heating in the prebaking step as described above, or a drying step other than heating (drying), such as vacuum drying, for removal of the volatile component such as a solvent, may separately be carried out prior to the prebaking step. Further, it is more preferred to employ heating which also serves as drying in the above prebaking step and vacuum drying in combination, for efficient drying without non-uniformity in the outer appearance of the photosensitive film. The conditions for vacuum drying vary depending on the types of the respective components, the blend proportions, etc., but preferably within wide ranges of from 500 to 10 Pa for from about 10 to about 300 seconds.

(Exposure Step)

After the prebaking step, an exposure step as shown in FIG. 1(II) is carried out. That is, the photosensitive film 2 on the substrate 1 is irradiated with light 5 via a mask 4 having a predetermined pattern. The light 5 is transmitted only through a predetermined pattern portion cut in the mask 4 and reaches the photosensitive film on the substrate 1, and only the photosensitive composition of that portion is photo-cured. Accordingly, for formation of partition walls, the above predetermined pattern is formed into a shape to fit the shape of the partition walls. For example, it is preferred in the present invention to employ a mask having a pattern formed so that after the post-baking step described hereinafter, the average width of the partition walls is preferably at most 100 μm, more preferably at most 20 μm and the average distance between the adjacent partition walls is preferably at most 300 μm, more preferably at most 100 μm.

Exposure is a step of irradiating the desired portion of the photosensitive film with light and its method is not particularly limited, and it is preferably carried out via a mask having a predetermined pattern as shown in FIG. 1(II). In FIG. 1(II), the exposed portion 3 of the photosensitive film irradiated with light is made of a photo-cured product of the photosensitive composition, whereas the non-exposed portion is a state where the uncured photosensitive film 2 itself remains.

The light 5 to be applied may, for example, be specifically visible light; ultraviolet rays; far ultraviolet rays; an excimer laser such as KrF excimer laser, ArF excimer laser, $F_2$ excimer laser, $Kr_2$ excimer laser, KrAr excimer laser or $Ar_2$ excimer laser; X-rays; or electron beams. Further, the light 5 is preferably electromagnetic waves having a wavelength of from 100 to 600 nm, more preferably light having a distribution in a range of from 300 to 500 nm, particularly preferably i-line (365 nm), h-line (405 nm) or g-line (436 nm).

As an irradiation apparatus (not shown), a known ultrahigh pressure mercury lamp or a deep UV lamp may, for example, be used. The light exposure is preferably from 5 to 1,000 mJ/cm$^2$, more preferably from 50 to 400 mJ/cm$^2$. If the light exposure is too low, curing of the photosensitive composition to be the partition walls will be inadequate, and in the subsequent development, dissolution or peeling from the substrate 1 may occur. If the light exposure is too high, it tends to be difficult to obtain a high resolution. Further, the light irradiation (exposure) time depends on the light exposure, the composition of the photosensitive composition, the thickness of the photosensitive film, etc., and is specifically from 1 to 60 seconds, preferably from 5 to 20 seconds.

(Development Step)

After the exposure step, development is carried out by a developer to remove the non-exposed portion 2 on the substrate 1 shown in FIG. 1(II), whereby a structure of the substrate 1 and partition walls 6 made of a photo-cured product of the photosensitive composition formed on the substrate, the cross section of which is shown in FIG. 1(III), is obtained. Further, the regions surrounded by the partition walls 6 and the substrate 1 are regions called dots 7 within which pixels are formed e.g. by ink injection. The obtained substrate 10 becomes a substrate which can be used for preparation of an optical device by an ink jet method, by means of the after-mentioned post-baking step.

The developer to be used for development may, for example, be an aqueous alkali solution containing an alkali such as an inorganic alkali, an amine, an alcohol amine or a quaternary ammonium salt. Further, to the developer, a surfactant or an organic solvent such as an alcohol may be added to improve the solubility and to remove the residue.

The development time (time during which the film is in contact with the developer) is preferably from 5 to 180 seconds. Further, the developing method may be any method such as a paddle method, a dipping method or a shower method. After the development, high pressure washing with water or washing with running water is carried out, followed by drying with compressed air or compressed nitrogen to remove moisture on the substrate 1 and the partition walls 6.

(Post-baking Step)

Then, it is preferred to heat the partition walls 6 on the substrate 1. The heating method may be a method of subjecting the partition walls 6 together with the substrate 1 to heat treatment by a heating device such as a hot plate or an oven preferably at from 150 to 250° C. for from 5 to 90 minutes. By this heat treatment, the partition walls 6 made of a photo-cured product on the substrate 1 will be further cured, and the shape of the dots 7 surrounded by the partition walls 6 and the substrate 1 will be more fixed. The heating temperature is more preferably at least 180° C. If the heating temperature is too low, post-curing of the photo-cured product tends to be inadequate, whereby no sufficient chemical resistance will be obtained, and accordingly, in a case where an ink is injected into the dots 7 in the subsequent ink jet coating step, the partition walls 6 may be swelled by a solvent contained in the ink, or the ink may bleed. On the other hand, if the heating temperature is too high, heat decomposition of the photo-cured product may occur.

It is possible to use the negative photosensitive resin composition of the present invention for pattern formation having a width of partition walls of preferably at most 100 μm, more preferably at most 20 μm on the average. Further, it is possible to use it for pattern formation having a distance (width of a dot) between adjacent partition walls of preferably at most 300 μm, more preferably at most 100 μm on the average. Further, it is possible to use it for pattern formation having a height of partition walls of preferably from 0.05 to 50 μm, more preferably from 0.2 to 10 μm on the average.

The present invention further provides a process for producing an optical device comprising a substrate, and a plurality of pixels and partition walls (partition walls to be produced by the above process of the present invention) located between the adjacent pixels, formed on the substrate. Now, the process for producing an optical device of the present invention will be described below.

<Process for Producing Optical Device of the Present Invention>

The process for producing an optical device of the present invention is applicable to production of an optical device comprising a substrate, and a plurality of pixels and partition walls located between the adjacent pixels formed on the substrate, and it comprises forming partition walls on a substrate by the above production process of the present invention, applying an ink affinity-imparting treatment to the surface of the substrate exposed to regions surrounded by the substrate and the partition walls, and injecting an ink into the regions by an ink jet method to form the pixels.

(Ink Affinity-imparting Treatment)

In the process for producing an optical device of the present invention, after formation of the partition walls by the above process of the present invention, an ink affinity-imparting treatment is applied to the surface of the substrate exposed within the regions (dots) surrounded by the substrate and the partition walls. The method of the ink affinity-imparting treatment may, for example, be cleaning with an aqueous alkali solution, UV cleaning, UV ozone cleaning, excimer cleaning, corona discharge treatment or oxygen plasma treatment. The cleaning with an aqueous alkali solution is a wet treatment of cleaning the surface of the substrate with an aqueous alkali solution (e.g. a potassium hydroxide or tetramethylammonium hydroxide aqueous solution). The UV cleaning is a dry treatment of cleaning the surface of the substrate by means of UV (ultraviolet rays). The UV ozone treatment is a dry treatment of cleaning the surface of the substrate by means of a low pressure mercury lamp which emits light at 185 nm and 254 nm. The excimer cleaning is a dry treatment of cleaning the surface of the substrate by means of a xenon excimer lamp which emits light at 172 nm. The corona discharge treatment is a dry treatment of cleaning the surface of the substrate utilizing high frequency high voltage to generate corona discharge in the air. The oxygen plasma treatment is a dry treatment of cleaning the surface of the substrate by exciting oxygen using e.g. a high frequency power source as a trigger mainly in vacuum to bring oxygen in a highly reactive "plasma state".

A dry treatment method such as the UV ozone cleaning is simple in the process and is preferred in the present invention. UV ozone may be generated by a commercially available apparatus. The ink affinity-imparting treatment can be conducted by placing the substrate on which the partition walls are formed in a UV ozone apparatus and carrying out the treatment in the air atmosphere at room temperature for from about 1 to about 10 minutes within a range not to impair the oil repellency of the partition walls. The treatment time is adjusted so that the oil repellency of the partition walls is not impaired, in accordance with the individual UV ozone apparatus.

By this ink affinity-imparting treatment, removal of impurities remaining in the dots after formation of the partition walls, etc., can be sufficiently carried out, whereby ink affinity can be sufficiently imparted to the dots, and accordingly edge leakage of e.g. a color display device employing the obtainable optical device can be prevented. Further, by using partition walls obtainable from the negative photosensitive resin composition of the present invention, it is possible to carry out the ink affinity-imparting treatment without decreasing the ink repellency of the partition walls, e.g. by the UV cleaning.

The water-and-oil repellency (ink repellency) of a photo-cured product formed from the photosensitive composition can be estimated by the contact angle to water and PGMEA (propylene glycol monomethyl ether acetate, an organic solvent frequently used as a solvent for an ink). With respect to the optical device produced by the production process of the present invention, the partition walls are required to have sufficient ink repellency even after the ink affinity-imparting treatment. Thus, the contact angle of the partition walls to water is preferably at least 90°, more preferably at least 95°. Further, in the same manner, the contact angle of the partition walls to PGMEA is preferably at least 40°, more preferably at least 50°. Further, the dots in an optical device produced by the production process of the present invention are required to have affinity with an ink, and their contact angle to water is preferably at most 20°, more preferably at most 10°.

(Ink Injection Step)

This is a step of injecting an ink by an ink jet method within the dots after the step of ink affinity-imparting treatment to form pixels. This step can be carried out in the same manner as the conventional method by using an ink jet apparatus commonly used for an ink jet method. Such an ink jet apparatus used for formation of pixels is not particularly limited, and it is possible to use an ink jet apparatus employing various methods, such as a method of continuously jetting an electrified ink and controlling it by a magnetic field, a method of periodically spraying an ink by using piezoelectric elements, a method of heating an ink and intermittently jetting it by utilizing its foaming.

In this specification, the "ink" generically means a liquid or solid (in the case of a solid, a solution or dispersion containing it) having an optical or electrical function for example after dried (or cured), and is not limited to conventionally employed coloring materials. Further, the same applies to the wording "pixels" formed by injecting the ink, and means compartments partitioned by the partition walls each having an optical or electrical function.

The optical device to which the process for producing an optical device of the present invention employing the partition walls of the present invention is preferably applied, may, for example, be specifically a color filter, an organic EL display device or an organic TFT array. Now, the application of the production process of the present invention to the above three types of optical devices will be described.

[Production of Color Filter]

In the case of producing a color filter employing the partition walls of the present invention, partition walls are formed by the above photolithography, the ink affinity-imparting treatment is carried out to the dots, and an ink is injected within the dots by an ink jet method to form pixels, thereby to produce a color filter.

Formation of the partition walls, the ink affinity-imparting treatment to the dots, and the ink injection by an ink jet method are as described above. In the color filter, the shape of the pixels to be formed may be any known configuration such as a stripe type, a mosaic type, a triangle type or a 4-pixel configuration type.

The ink to be used for forming pixels mainly comprises a coloring component, a binder resin component and a solvent. As the coloring component, it is preferred to employ a pigment or dye excellent in the heat resistance, light resistance, etc. As the binder resin component, a transparent resin excellent in the heat resistance is preferred, such as an acrylic resin, a melamine resin or an urethane resin. A water-base ink comprises, as the solvent, water and, if necessary, a water-soluble organic solvent, and as the binder resin component, a water-soluble resin or a water-dispersible resin, and it contains various additives as the case requires. Whereas, an oil-base ink comprises an organic solvent as the solvent and a resin soluble in the organic solvent as the binder resin component, and it contains various additives as the case requires.

Further, after injecting an ink by an ink jet method, if required, it is preferred to carry out drying, heat-curing or ultraviolet ray-curing.

After forming pixels, an overcoat layer may be formed as the case requires. Such an overcoat layer is formed preferably for the purpose of improving the surface flatness and for the purpose of preventing an eluent from the ink at partition walls or pixels from reaching the liquid crystal layer. In a case where such an overcoat layer is to be formed, it is preferred to preliminarily remove the ink repellency of the partition walls. In a case where the ink repellency is not removed, the overcoating liquid will be repelled, and a uniform film thickness tends to be hardly obtainable, such being undesirable. The method for removing the ink repellency of the partition walls may, for example, be plasma ashing treatment or optical ashing treatment.

Further, as the case requires, it is preferred to form a photospacer on the black matrix comprising the partition walls to improve the product quality of a liquid crystal panel to be produced by using a color filter.

[Production of Organic EL Display Device]

After the partition walls are formed by the production process of the present invention as described above, an ink affinity-imparting treatment is carried out on the dots and an ink is injected within the dots by an ink jet method to form pixels thereby to produce an organic EL display device.

Before the partition walls are formed, a transparent electrode of e.g. indium tin doped oxide (ITO) is formed by e.g. a sputtering method on a transparent substrate of e.g. glass, and if necessary, the transparent electrode is etched to have a desired pattern. Then, the partition walls of the present invention are formed and the ink affinity-imparting treatment is carried out on the dots, and then by using an ink jet method, solutions of a hole transport material and a luminescent material are sequentially applied within the dots and dried to form a hole transport layer and a luminescent layer. Then, an electrode of e.g. aluminum is formed by e.g. a vapor deposition method, whereby pixels for an organic EL display device will be obtained.

[Production of Organic El Lighting Device]

An organic EL lighting device can be produced in the same manner as in the production of an organic EL display device. A luminescent layer may be formed by laminating luminous bodies which respectively generate red, green and blue, by an ink jet method, or it may be formed by applying the luminous bodies separately on the flat surface.

[Production of Organic TFT Array]

After partition walls are formed by the production process of the present invention as described above, an ink affinity-imparting treatment is carried out on the dots, and an ink is injected within the dots by an ink jet method to form pixels thereby to produce an organic TFT array. More specifically, an organic TFT array can be produced by the following method.

(1) Partition walls of the present invention are formed on a transparent substrate of e.g. glass. After an ink affinity-imparting treatment on the dots, a solution of a gate electrode material is applied within the dots by using an ink jet method to form a gate electrode.

(2) After the gate electrode is formed, a gate insulating film is formed thereon. Partition walls of the present invention are formed on the gate insulating film, and an ink affinity-imparting treatment is carried out on the dots, and then by using an ink jet method, a solution of a source drain electrode material is applied within the dots to form a source drain electrode.

(3) After the source drain electrode is formed, partition walls of the present invention are formed to surround a region including a pair of such source drain electrodes, and an ink affinity-imparting treatment is carried out on the dots, and then by using an ink jet method, a solution of an organic semiconductor is applied within the dots to form an organic semiconductor layer between the source drain electrodes.

In the above steps (1) to (3), the partition walls of the present invention may be utilized only in one step, or the partition walls of the present invention may be utilized in two or more steps.

EXAMPLES

Now, the present invention will be described in further detail with reference to Examples, but the present invention is by no means restricted thereto. First of all, Preparation Example 1 and Preparation Example 2 are examples for preparation of an ink repellent (A) which the negative photosensitive resin composition of the present invention contains. Further, with respect to the solution of the ink repellent (A) obtained in Preparation Examples, the silanol group concentration (mmol/g) in the solution was measured. Further, with respect to the negative photosensitive resin composition to which the solution is blended, the silanol group concentration (mmol/g) derived from the ink repellent (A), based on the total amount of the composition, was calculated.

(Method for Measurement of Silanol Group Concentration)

With respect to the solution containing the ink repellent (A), the amount of silanol groups contained in the solution is measured by $^{29}$Si-NMR measurement as mentioned below. Then, the amount of silanol groups on average per silicon atom derived from the ink repellent (A) is calculated by the above method. From the concentration (this value can be calculated from a charge value) of silicon atoms in the solution employed for the measurement, a silanol group concentration in the solution is calculated.

(Method of Measurement of Peaks by $^{29}$Si-NMR)

Each sample was subjected to $^{29}$Si-NMR by using a nuclear magnetic resonance analyzer (ECA600, manufactured by JEOL Ltd.). The probe was T10, and a 10 mmϕ tube made of a polytetrafluoroethylene (PTFE) was used as a sample tube. The measuring conditions are such that the resonance frequency was 119.2 MHz, the pulse width was 22.5 μsec, the waiting time was 30 sec, and the cumulated number was 1,000 times.

Measurement was carried out by using, as a standard, a shielding constant of a methyl group in tetramethylsilane, peaks corresponding to a range of a chemical shift in the following Table 1 were regarded as T1 to Q4 which represent molecular structures in classification of a structure of the hydrolyzable silane compound.

Each peak intensity was calculated after spectrum derived from background was subtracted from spectrum derived from a sample.

TABLE 1

|  | Structure | | | | | | |
| --- | --- | --- | --- | --- | --- | --- | --- |
|  | T1 | T2 | T3 | Q1 | Q2 | Q3 | Q4 |
| Chemical shift range (ppm) | −48 to −53 | −54 to −60 | −63 to −68 | −79 to −85 | −87 to −94 | −96 to −101 | −106 to −112 |

In Table 1, a unit of numerical value showing a peak range is ppm.

Preparation Example 1

Into a 50 cm³ three-necked flask equipped with a stirrer, 0.5 g of $CF_3(CF_2)_5CH_2CH_2Si(OCH_3)_3$ (manufactured by Asahi Glass Company, Limited: corresponding to the above compound (a1)), 1.1 g of $Si(OC_2H_5)_4$ (manufactured by COLCOAT CO., LTD.: corresponding to the above compound (a2)) and 0.63 g of $CH_2=CHCOO(CH_2)_3Si(OCH_3)_3$ (manufactured by TOKYO CHEMICAL INDUSTRY CO., LTD.: corresponding to the above compound (a5)) were put. Then, PGMEA (8.84 g) was put.

1.2 g of a 1.0% nitric acid aqueous solution was dropwise added to the above mixture with stirring at room temperature. After completion of the dropwise addition, stirring was carried out further for 5 hours. This solution (a PGMEA solution containing 10 mass % of the ink repellent (A1)) is regarded as liquid A-1. The fluorine atom content of the composition having the solvent removed from the obtained liquid A-1 is 21.5%. Further, the number average molecular weight of the composition having the solvent removed from liquid A-1 was 1,250.

The silanol group concentration in the obtained liquid A-1 was calculated from the concentration (charged concentration: 0.74 (mmol/g)) of silicon atoms in the solution and the following measurement result of $^{29}$Si-NMR, and it was found to be 0.72 (mmol/g).

Further, the number (ratio) of each silanol structure measured by $^{29}$Si-NMR is shown in Table 2. The number of silanol groups on average per silicon atom in the above unit T derived from the trifunctional hydrolyzable silane compound having three hydrolyzable groups is 0.71, and the number of silanol groups on average per silicon atom in the above unit Q derived from the tetrafunctional hydrolyzable silane compound having four hydrolyzable groups was 1.17. Further, the number of silanol groups on average per silicon atom as the entire ink repellent (A1) was 0.97.

TABLE 2

| | Structure | | | | | | |
|---|---|---|---|---|---|---|---|
| | T1 | T2 | T3 | Q1 | Q2 | Q3 | Q4 |
| Number | 1 | 8 | 5 | 0 | 5 | 11 | 2 |

Preparation Example 2

The ink repellent (A2) was prepared in the same manner as in Example 1 except that the solvent was changed from PGMEA to propylene glycol monomethyl ether (PGME). This liquid is regarded as liquid A-2. The fluorine atom content of the composition having the solvent removed from the obtained liquid A-2 was 21.5%. The number average molecular weight of the composition having the solvent removed from the liquid A-2 was 1,050.

The silanol group concentration in the obtained liquid A-2 (a PGME solution containing 10 mass % of the ink repellent (A2)) was calculated from the concentration (charged concentration: 0.74 (mol/g)) of silicon atoms in the solution and the measurement result of the following $^{29}$Si-NMR, and it was found to be 0.94 (mmol/g).

Further, the number (ratio) of each silanol structure measured by $^{29}$Si-NMR is shown in Table 3. The number of silanol groups on average per silicon atom in the above unit T derived from the trifunctional hydrolyzable silane compound having three hydrolyzable groups was 0.93, and the number of silanol groups on average per silicon atom of the above unit Q derived from the tetrafunctional hydrolyzable silane compound having four hydrolyzable groups was 1.53. Further, the number of silanol groups on average per silicon atom as the entire ink repellent (A2) was 1.27.

TABLE 3

| | Structure | | | | | | |
|---|---|---|---|---|---|---|---|
| | T1 | T2 | T3 | Q1 | Q2 | Q3 | Q4 |
| Number | 2 | 9 | 3 | 1 | 9 | 8 | 1 |

Preparation Example 3

Into a 50 cm³ three-necked flask equipped with a stirrer, 0.5 g of $CF_3(CF_2)_5CH_2CH_2Si(OCH_3)_3$ (manufactured by Asahi Glass Company, Limited), 2.8 g of $Si(OC_2H_5)_4$ (manufactured by COLCOAT CO., LTD.) were put. Then, PGMEA (7.0 g) was put.

2.0 g of a 1.0% nitric acid aqueous solution was dropwise added to the above mixture with stirring at room temperature. After completion of the dropwise addition, stirring was carried out further for 5 hours. This liquid (a PGMEA solution containing 10 mass % of the ink repellent (A3)) is regarded as liquid A-3. The fluorine atom content of the composition having the solvent removed from the obtained liquid A-3 was 21.5%.

The silanol group concentration in the obtained liquid A-3 was calculated from the concentration (charged concentration: 1.17 (mmol/g)) of silicon atoms in the solution and the measurement result of the following $^{29}$Si-NMR, and it was found to be 0.76 (mmol/g). Further, according to the measurement result of $^{29}$Si-NMR, the number of silanol groups on average per silicon atom as the entire ink repellent (A-3) was 0.65.

Example 1-1

Preparation of Negative Photosensitive Resin Composition 3.9 g of CCR-1159 (manufactured by Nippon Kayaku Co., Ltd.: a resin having a carboxyl group and an ethylenic double bond introduced to an epoxy resin, photosensitive resin (B)), 5.0 g of a 50% PGME solution of A9530 (a mixture of dipentaerythritol hexaacrylate with dipentaerythritol pentaacrylate, manufactured by Shin-Nakamura Chemical Co., Ltd.: radical crosslinking agent (E), 1.5 g of 20% PGME solution of IRGACURE907 (2-methyl-1-[4-(methylthio) phenyl]-2-morpholinopropan-1-one, manufactured by Ciba-Geigy Company: photopolymerization initiator (C)), 1.9 g of a 10% PGME solution of diethyldiaminobenzophenone (manufactured by TOKYO CHEMICAL INDUSTRY CO., LTD., sensitizer), 0.2 g of liquid A-1 (a PGMEA solution containing 10.0 mass % of the ink repellent (A1)) and 7.5 g of PGME were put in a container for stirring and stirred for 30 minutes to prepare a negative photosensitive resin composition 1 of the present invention. The silanol group concentration in the obtained negative photosensitive resin composition 1 was 0.0072 (mmol/g).

(Preparation of Photosensitive Cured Product)

A 5 cm square glass substrate was subjected to ultrasonic cleaning with ethanol for 30 seconds and then subjected to UV/$O_3$ (UV ozone) cleaning for 5 minutes. For the above UV/$O_3$ cleaning, PL7-200 (Senengineering Co., Ltd.) was used as a UV ozone generator. For all the following UV ozone treatment, this apparatus was used as the UV ozone generator.

On the above glass substrate after cleaned, the above obtained negative photosensitive resin composition 1 was applied by using a spinner and dried by heating on a hot plate at 100° C. for 2 minutes to form a photosensitive film having a thickness of 2.0 μm. The surface of the obtained coating film was irradiated with 10 mW/cm² of ultraviolet rays from a high pressure mercury lamp for 10 seconds from the photosensitive film side via a photomask having an open pattern (2.5 cm×5 cm).

Then, the above glass substrate which was subjected to the exposure treatment, was dipped in a 0.1% tetramethylammonium hydroxide aqueous solution for 40 seconds for development, and the non-exposed portion of the photosensitive film was washed off with water, followed by drying. Then, the glass substrate was heated on a hot plate at 230° C. for 20 minutes to obtain glass substrate (1) on which a photo-cured product from the negative photosensitive resin composition 1 having the above open pattern size was formed.

(Evaluation of Ink Repellency and Ink Affinity at Exposed Portion and Non-exposed Portion)

The contact angles of the surface of the photo-cured product (exposed portion) and the surface of the glass substrate (non-exposed portion on which the photosensitive film was removed by development, hereinafter simply referred to as "non-exposed portion") of glass substrate (1) obtained by the above steps to water and PGMEA were measured by the following methods. Then, UV/$O_3$ irradiation was carried out for 5 minutes on the entire surface on the side where the photo-cured product was formed of glass substrate (1) on which the photo-cured product was formed, obtained by the above steps. The contact angles of the surface of the photo-cured product and the surface of the glass substrate at the non-exposed portion to water and PGMEA were measured after every one minute of irradiation, and the changes were evaluated. The measurement results are shown in Table 4.

<Measurement Method>

The contact angle to water was measured by putting water droplets on three different spots on the surface of the substrate to be measured, and each droplet was measured in accordance with JIS R3257 "Testing Method of Wettability of Glass Substrate" by the sessile drop test method. The droplet was 2 μL/droplet, and the measurement was carried out at 20° C. The contact angle is represented by an average value of three droplets (n=3).

The contact angle to PGMEA was measured by puffing PGMEA droplets on three different spots on the surface of the substrate to be measured, and each droplet was measured in accordance with JIS R3257 "Testing Method of Wettability of Glass Substrate" by the sessile drop test method. The droplet was 2 μL/droplet, and the measurement was carried out at 20° C. The contact angle is represented by an average value of three droplets (n=3).

TABLE 4

| Measurement sample | | UV/$O_3$ irradiation time (min) Contact angle (degree) after each UV/$O_3$ irradiation time (min) | | | | | |
|---|---|---|---|---|---|---|---|
| | | 0 | 1 | 2 | 3 | 4 | 5 |
| Surface of photo-cured product | Water | 96 | 91 | 76 | 81 | 73 | 64 |
| | PGMEA | 48 | 47 | 43 | 42 | 38 | 34 |
| Non-exposed portion | Water | 58 | 31 | 22 | 7 | 4 | 1 |
| | PGMEA | 0 | 0 | 0 | 0 | 0 | 0 |

As shown in Table 4, after the UV/$O_3$ irradiation was carried out for 3 minutes, the contact angles of the surface of the glass substrate at the non-exposed portion to water and PGMEA were decreased to 10° or below. This means that residues such as the non-exposed photosensitive resin composition at the non-exposed portion were sufficiently removed, and the ink affinity was imparted. At this time, the contact angles of the surface of the photo-cured product to water and PGMEA were 81° and 42°, respectively, and were maintained to be sufficiently high. Thus, it was found that the ink affinity was imparted to the non-exposed portion without decreasing the water repellency and the oil repellency on the surface of the photo-cured product.

This negative photosensitive resin composition 1 was stored for one month in a refrigerator, but no change was observed in appearance, and it was confirmed that the storage stability was good.

Example 1-2

A glass substrate on which a photo-cured product from the negative photosensitive resin composition 1 was formed was obtained in the same manner as in Example 1-1 except that a photomask having a line/space of 20 μm was used. As observed by a laser microscope (manufactured by Keyence Corporation), it was found that banks having a height of 1.4 μm, a top width of 18.6 μm and a bottom width of 26.1 μm were formed.

Example 2

A negative photosensitive resin composition 2 was prepared in the same manner as in Example 1 except that liquid A-2 was used instead of liquid A-1 as the ink repellent (A). The silanol group concentration in the obtained negative photosensitive resin composition 2 was calculated, and it was found to be 0.0094 (mmol/g).

Further, glass substrate (2) on which a photo-cured product was formed from the negative photosensitive resin composition 2, was obtained in the same manner as in Example 1 by using the obtained negative photosensitive resin composition 2. With respect to glass substrate (2), in the same manner as in Example 1, the ink repellency and the ink affinity were evaluated by UV/$O_3$ irradiation for 5 minutes with respect to the surface of the photo-cured product and the surface of the glass substrate at the non-exposed portion. The results are shown in Table 5.

TABLE 5

| Measurement sample | | UV/$O_3$ irradiation time (min) Contact angle (degree) after each UV/$O_3$ irradiation time (min) | | | | | |
|---|---|---|---|---|---|---|---|
| | | 0 | 1 | 2 | 3 | 4 | 5 |
| Surface of photo-cured product | Water | 92 | 85 | 80 | 79 | 75 | 74 |
| | PGMEA | 46 | 42 | 40 | 39 | 34 | 33 |
| Non-exposed portion | Water | 56 | 10 | 5 | 4 | 3 | 2 |
| | PGMEA | 2 | 1 | 1 | 1 | 1 | 1 |

As shown in Table 5, after the UV/$O_3$ irradiation was carried out for 1 minute, the contact angles of the surface of the glass substrate at the non-exposed portion to water and PGMEA were decreased to 10° or below. This means that residues such as the non-exposed photosensitive composition at the non-exposed portion were sufficiently removed, and the ink affinity was imparted. At this time, the contact angles of the surface of the photo-cured product to water and PGMEA were 85° and 42°, respectively, and were maintained to be high. Thus, it was found that the ink affinity was imparted to the non-exposed portion without decreasing the water repellency and the oil repellency on the surface of the photosensitive cured product.

This negative photosensitive resin composition 2 was stored for one month in a refrigerator, but no change was observed in appearance, and it was confirmed that the storage stability was good.

Example 3

A negative photosensitive resin composition 3 was prepared in the same manner as in Example 1 except that liquid A-3 was used instead of liquid A-1 as the ink repellent (A). The silanol group concentration in the obtained negative photosensitive resin composition 3 was calculated, and it was found to be 0.0076 (mmol/g).

Further, glass substrate (3) on which a photo-cured product was formed from the negative photosensitive resin composition 3, was obtained in the same manner as in Example 1 by using the obtained negative photosensitive resin composition 3. With respect to glass substrate (3), in the same manner as in Example 1, the ink repellency and the ink affinity were evaluated by $UV/O_3$ irradiation for 5 minutes with respect to the surface of the photo-cured product and the surface of the glass substrate at the non-exposed portion. The results are shown in Table 6.

TABLE 6

| Measurement sample | | $UV/O_3$ irradiation time (min) Contact angle (degree) after each $UV/O_3$ irradiation time (min) | | | | | |
|---|---|---|---|---|---|---|---|
| | | 0 | 1 | 2 | 3 | 4 | 5 |
| Surface of photo-cured product | Water | 93 | 86 | 83 | 83 | 83 | 83 |
| | PGMEA | 45 | 42 | 42 | 42 | 38 | 35 |
| Non-exposed portion | Water | 56 | 31 | 10 | 5 | 4 | 3 |
| | PGMEA | 2 | 1 | 2 | 2 | 1 | 1 |

As shown in Table 6, after the $UV/O_3$ irradiation was carried out for 2 minutes, the contact angles of the surface of the glass substrate at the non-exposed portion to water and PGMEA were decreased to 10° or below. This means that residues such as the non-exposed photosensitive composition at the non-exposed portion were sufficiently removed, and the ink affinity was imparted. At this time, the contact angles of the surface of the photo-cured product to water and PGMEA were 83° and 42°, respectively, and were maintained to be high. Thus, it was found that the ink affinity was imparted to the non-exposed portion without decreasing the water repellency and the oil repellency on the surface of the photo-cured product.

This negative photosensitive resin composition 3 was stored for one month in a refrigerator, but no change was observed in appearance, and it was confirmed that the storage stability was good.

Example 4

A negative photosensitive resin composition 4 was prepared in the same manner as in Example 2 except that a mixed solvent of PGME: 90 wt %, isopropyl alcohol: 5 wt % and water: 5 wt % was used instead of PGME, in preparation of a negative photosensitive resin composition.

Further, glass substrate (4) on which a photo-cured product was formed from the negative photosensitive resin composition 4, was obtained in the same manner as in Example 1 by using the obtained negative photosensitive resin composition 4. With respect to glass substrate (4), in the same manner as in Example 1, the ink repellency and the ink affinity were evaluated by $UV/O_3$ irradiation for 5 minutes with respect to the surface of the photo-cured product and the surface of the glass substrate at the non-exposed portion. The results are shown in Table 7.

TABLE 7

| Measurement sample | | $UV/O_3$ irradiation time (min) Contact angle (degree) after each $UV/O_3$ irradiation time (min) | | | | | |
|---|---|---|---|---|---|---|---|
| | | 0 | 1 | 2 | 3 | 4 | 5 |
| Surface of photo-cured product | Water | 99 | 92 | 87 | 78 | 67 | 56 |
| | PGMEA | 48 | 46 | 45 | 41 | 36 | 31 |
| Non-exposed portion | Water | 58 | 31 | 1 | 0 | 0 | 0 |
| | PGMEA | 0 | 0 | 0 | 0 | 0 | 0 |

As shown in Table 7, after the $UV/O_3$ irradiation was carried out for 2 minutes, the contact angles of the surface of the glass substrate at the non-exposed portion to water and PGMEA were decreased to 10° or below. This means that residues such as the non-exposed photosensitive composition at the non-exposed portion were sufficiently removed, and the ink affinity was imparted. At this time, the contact angles of the surface of the photo-cured product to water and PGMEA were 87° and 45°, respectively, and were maintained to be high. Thus, it was found that the ink affinity was imparted to the non-exposed portion without decreasing the water repellency and the oil repellency on the surface of the photo-cured product.

This negative photosensitive resin composition 4 was stored for three months in a refrigerator, but no change was observed in appearance, and it was confirmed that the storage stability was good.

Comparative Example 1

A negative photosensitive resin composition 5 was prepared in the same manner as in Example 1 except that toluene was used instead of PGME, in preparation of a negative photosensitive resin composition.

Further, glass substrate (5) on which a photo-cured product was formed from the negative photosensitive resin composition 5, was obtained in the same manner as in Example 1 by using the obtained negative photosensitive resin composition 5. At this time, fluid of the negative photosensitive resin composition 5 was turbid, and no storage stability was confirmed. It is considered that the fluid of the negative photosensitive resin composition 5 was turbid because silanol groups which are unstable were crosslinked with each other to increase the molecular weight, whereby to a polymer insoluble in a solvent was formed. In such a case, it is considered that the silanol group concentration decreases due to reaction, and thereby deviates from the range of the present application. Further, with respect to the glass substrate (5), the contact angles of the surface of the photo-cured product to water and PGMEA were measured in the same manner as in Example 1, but the contact angles were 67° and 28° respectively, and therefore no adequate water repellency and oil repellency were observed.

INDUSTRIAL APPLICABILITY

The ink repellent (A) in the present invention has good storage stability and excellent ink repellency and UV ozone resistance. The ink repellent (A) using a solvent selected from solvents having a relative dielectric constant within a specific range or a specific structure, is particularly excellent in storage stability. Further, the negative photosensitive resin composition of the present invention comprising the ink repellent (A) of the present invention and using a solvent selected from solvents having a relative dielectric constant within a specific range or a specific structure, is excellent in storage stability, and further in a substrate for an optical device comprising dots and partition walls formed by using the negative photosensitive resin composition, ink affinity can be imparted to dots without decreasing the ink repellency of partition walls. Such a negative photosensitive resin composition of the present invention is suitably used for formation of partition walls for production of a color filter, for production of an organic EL display device, and for production of an organic TFT array, utilizing ink jet recording technology.

This application is a continuation of PCT Application No. PCT/JP2011/078488, filed on Dec. 8, 2011, which is based upon and claims the benefit of priority from Japanese Patent Application No. 2010-276315 filed on Dec. 10, 2010. The contents of those applications are incorporated herein by reference in its entirety.

REFERENCE SYMBOLS

1: Substrate, 2: photosensitive film, 3: photosensitive film exposed portion, 4: mask, 5: light, 6: partition walls, 7: dots, 10: substrate for optical device to which ink jet method is applicable

What is claimed is:

1. A negative photosensitive resin composition comprising:
an ink repellent (A) made of a fluorosiloxane compound comprising: a hydroxy group bonded to a silicon atom: and fluorine atoms in a proportion of from 10 to 55 mass % based on a total amount of the fluorosiloxane compound;
a photosensitive resin (B) comprising an acidic group and an ethylenic double bond in one molecules;
a photopolymerization initiator (C); and
a solvent (D), wherein a proportion of the ink repellent (A) is from 0.01 to 10 mass % based on a total solid content of the negative photosensitive resin composition, and a proportion of the hydroxy groups bonded to a silicon atom derived from the ink repellent (A) is from 0.000001 to 1.0 mmol/g based on a total amount of the negative photosensitive resin composition.

2. The negative photosensitive resin composition according to claim 1, wherein the proportion of the silicon atoms derived from the ink repellent (A) is from 0.000001 to 1.0 mmol/g based on the total amount of the negative photosensitive resin composition.

3. The negative photosensitive resin composition according to claim 1, wherein the number of the hydroxy groups bonded to a silicon atom in the ink repellent (A) is from 0.2 to 3.5 on average per silicon atom.

4. The negative photosensitive resin composition according to claim 1, wherein the solvent (D) comprises, as a main component:
(1) a $C_{3-10}$ hydrocarbon which is other than an alicyclic hydrocarbon and which has a hydroxy group and may have etheric oxygen,
(2) a $C_{6-10}$ alicyclic hydrocarbon having a hydroxy group, or
(3) an organic solvent having a relative dielectric constant of from 10 to 30 and having no hydroxy group.

5. The negative photosensitive resin composition according to claim 1,
wherein the fluorosiloxane compound comprises a partially hydrolyzed condensate of a hydrolysable silane compound comprising: an organic group which may comprise a fluorine atom; and a hydrolysable group bonded to a silicon atom;
wherein the number of the organic groups is p, wherein p is 0, 1, or 2, and the number of the hydrolysable groups is 4-p; and
wherein the hydrolysable silane compound comprises a fluoroorganic group.

6. The negative photosensitive resin composition according to claim 5, wherein the fluoroorganic group comprises a $C_{4-8}$ perfluoroalkyl group or a $C_{4-9}$ perfluoroalkyl group containing an etheric oxygen atom.

7. The negative photosensitive resin composition according to claim 5, wherein the hydrolyzable silane compound comprises a compound represented by formula (a1) and a compound represented by formula (a2):

(a1)

(a2)

wherein in the formulae (a1) and (a2),
$R^F$ is an organic group comprising a $C_{3-10}$ perfluoroalkyl group which may comprise an etheric oxygen atom;
$R^H$ is a hydrocarbon group;
X is a hydrolysable group, and
p is 0, 1 or 2;
when a plurality of $R^H$s are present, the plurality of $R^H$s may be the same or different from each other, and when a plurality of Xs are present, the plurality of Xs may be the same or different from each other.

8. The negative photosensitive resin composition according to claim 1, further comprising a radical crosslinking agent (E) comprising at least two ethylenic double bonds and not comprising an acidic group.

9. The negative photosensitive resin composition according to claim 1, wherein the acidic group included in the photosensitive resin (B) is a carboxy group, a phenolic hydroxy group, a sulfonic acid group, a phosphoric acid group, or a combination thereof.

10. The negative photosensitive resin composition according to claim 1, wherein the acidic group included in the photosensitive resin (B) is a carboxy group.

11. The negative photosensitive resin composition according to claim 1, wherein an acid value of the photosensitive resin (B) is from 10 to 300 mgKOH/g.

12. The negative photosensitive resin composition according to claim 1, wherein an acid value of the photosensitive resin (B) is from 30 to 150 mgKOH/g.

13. The negative photosensitive resin composition according to claim 1, wherein the proportion of the ink repellent (A) is from 0.01 to 1 mass % based on the total solid content of the negative photosensitive resin composition.

14. The negative photosensitive resin composition according to claim 1, wherein the photopolymerization initiator (C) includes a compound which generates radicals by light.

15. Partition walls for an optical device, comprising a cured product of a composition obtained by removing the solvent (D) from the negative photosensitive resin composition as defined in claim 1.

16. A process for producing partition walls for an optical device, the process comprising:
applying the negative photosensitive resin composition as defined in claim 1 on a substrate to form a coating film of the negative photosensitive resin composition;
prebaking the coating film to remove the solvent (D);

exposing selectively the prebaked coating film such that a first portion of the coating film is photo-cured, the first portion being a portion in which the partition walls are formed;

developing the selectively exposed coating film to remove a second portion of the coating film to form the partition walls, the second portion is a portion other than the first portion of the coating film; and post-baking the partition walls.

17. A process for producing an optical device; comprising:
producing partition walls on the substrate by the process as defined in claim 16; and
injecting an ink within regions surrounded by the substrate and the partition walls to form pixels.

18. The process according to claim 17, further comprising applying an ink affinity-imparting treatment to the surface of the substrate surrounded by the partition walls, after the partition walls are formed and before the ink is injected.

19. The process according to claim 18, wherein the ink affinity-imparting treatment is at least one selected from the group consisting of UV cleaning, UV ozone cleaning, excimer cleaning, corona discharge treatment and oxygen plasma treatment.

20. The process according to claim 17, wherein the optical device is an organic EL display device, a color filter or an organic TFT array.

* * * * *